(12) United States Patent
Oshiyama et al.

(10) Patent No.: US 7,862,909 B2
(45) Date of Patent: Jan. 4, 2011

(54) ORGANIC ELECTROLUMINESCENT ELEMENT, ILLUMINATOR AND DISPLAY

(75) Inventors: Tomohiro Oshiyama, Hachioji (JP); Hiroshi Kita, Hachioji (JP); Eisaku Katoh, Hachioji (JP)

(73) Assignee: Konica Minolta Holdings, Inc., Tokyo (JP)

( * ) Notice: Subject to any disclaimer, the term of this patent is extended or adjusted under 35 U.S.C. 154(b) by 0 days.

(21) Appl. No.: 12/082,251

(22) Filed: Apr. 10, 2008

(65) Prior Publication Data

US 2008/0233431 A1    Sep. 25, 2008

Related U.S. Application Data

(62) Division of application No. 10/562,652, filed as application No. PCT/JP2004/009391 on Jun. 25, 2004, now Pat. No. 7,371,469.

(30) Foreign Application Priority Data

Jul. 8, 2003 (JP) ............................. 2003-193519

(51) Int. Cl.
   H01L 51/54      (2006.01)
   C09K 11/00     (2006.01)

(52) U.S. Cl. ..................... 428/690; 428/917; 313/504; 313/506; 252/301.16; 252/301.21; 257/40; 257/88; 257/89; 257/103; 257/E51.022; 257/E51.051; 564/336

(58) Field of Classification Search .......... 257/E51.051; 548/342.5
   See application file for complete search history.

(56) References Cited

U.S. PATENT DOCUMENTS

| | | | |
|---|---|---|---|
| 5,948,941 A * | 9/1999 | Tamano et al. .............. | 564/315 |
| 6,358,633 B1 | 3/2002 | Sano et al. | |
| 6,750,608 B2 | 6/2004 | Matsuura et al. | |
| 2002/0094452 A1* | 7/2002 | Ueda et al. ................. | 428/690 |
| 2002/0106530 A1* | 8/2002 | Ishibashi et al. ............ | 428/690 |
| 2003/0091860 A1 | 5/2003 | Oshiyama et al. | |
| 2003/0186079 A1 | 10/2003 | Towns | |
| 2003/0194577 A1 | 10/2003 | Towns | |
| 2003/0218418 A9* | 11/2003 | Sato et al. ................... | 313/504 |
| 2004/0056266 A1 | 3/2004 | Suh et al. | |
| 2004/0066135 A1 | 4/2004 | Lecloux et al. | |
| 2004/0094452 A1 | 5/2004 | Scott, III et al. | |
| 2004/0110031 A1 | 6/2004 | Fukuda et al. | |
| 2004/0214041 A1 | 10/2004 | Lu et al. | |
| 2006/0228576 A1 | 10/2006 | Burroughes | |
| 2006/0252963 A1 | 11/2006 | Burn | |

FOREIGN PATENT DOCUMENTS

| | | | |
|---|---|---|---|
| EP | 1 202 608 A2 | 2/2002 | |
| JP | 63-264692 A | 11/1988 | |
| JP | 3-255190 A | 11/1991 | |
| JP | 08 008065 A | 1/1996 | |
| JP | 10-302960 A | * 11/1998 | |
| JP | 2000-21572 A | 1/2000 | |
| JP | A 2000-150168 | 5/2000 | |
| JP | 3093796 B2 | 7/2000 | |
| JP | 2001-284056 A | 10/2001 | |
| JP | 2002-8860 A | 1/2002 | |
| JP | 2003-31371 A | 1/2003 | |
| JP | A 2003-45663 | 2/2003 | |
| JP | A 2003-86376 | 3/2003 | |
| WO | WO 01/59030 A | 8/2001 | |
| WO | WO 2004/041902 A | 5/2004 | |

OTHER PUBLICATIONS

English machine translation of JP 10-302960 A 1998.*
Thelakkat M. et al; "Low Molecular Weight and Polymeric Heterocyclics as Electron Transport/Hole-Blocking Materials in Organic Light-Emitting Diodes", Polymers for Advanced Technologies, Wiley & Sons, Bognor Regis, GB, vol. 9, No. 7, Jul. 1, 1998, pp. 429-442, XP000774223, ISSN: 1042-7147.
R. Bilke, et al; "Influence of Energy Levels on the Electronic Properties of Organic Light Harvesting Devices", Synthetic Metals, vol. 124, 2001, pp. 91-93, XP002480686.
Fink R, et al; "Aromatic Polyethers with 1,3,5-Triazine Units as Hole Blocking/Electron Transport Materials in LEDS", Polymer Preprints, American Chemical Society, US, vol. 38, No. 1, Apr. 1, 1997, p. 323/324, XP002049555, ISSN: 0032-3934.
Okumoto Kenji et al; "Development of High-Performance Blue-Violet-Emitting Organic Electroluminescent Devices", Applied Physics Letters, AIP, American Institute of Physics, Melville, NY, vol. 79, No. 9, Aug. 27, 2001, pp. 1231-1233, XP012030130, ISSN: 0003-6951.

* cited by examiner

*Primary Examiner*—D. Lawrence Tarazano
*Assistant Examiner*—Michael Wilson
(74) *Attorney, Agent, or Firm*—Holtz, Holtz, Goodman & Chick, P.C.

(57) ABSTRACT

An organic electroluminescent element comprising an anode and a cathode having therebetween an emission layer containing a phosphorescent compound and an layer adjacent to the emission layer, the layer adjacent to the emission layer being provided between the emission layer and the cathode, wherein the layer adjacent to the emission layer comprises a compound having an electron withdrawing group; and the compound exhibits a HOMO level of −5.7 to −7.0 eV and a LUMO level of −1.3 to −2.3 eV.

11 Claims, 3 Drawing Sheets

US 7,862,909 B2

ORGANIC ELECTROLUMINESCENT ELEMENT, ILLUMINATOR AND DISPLAY

This application is a divisional of application Ser. No. 10/562,652 filed Dec. 27, 2005 (now U.S. Pat. No. 7,371, 469), a National Phase of International Application PCT/JP2004/009391 filed Jun. 25, 2004 which is incorporated herein in its entirety by this reference.

TECHNICAL FIELD

The present invention relates to an organic electroluminescent element, an illuminator and a display, and, in detail, relates to an organic electroluminescent element, an illuminator and a display, exhibiting high luminance, high emission efficiency and long life.

BACKGROUND

As an emission type electronic displaying device, an electroluminescent device (ELD) is known. Elements constituting the ELD include an inorganic electroluminescent element and an organic electroluminescent element (hereinafter also referred to as an organic EL element). Inorganic electroluminescent elements have been used for a plane light source, however, a high voltage alternating current has been required to drive the element.

An organic EL element has a structure in which a light emitting layer containing a light emitting compound is arranged between a cathode and an anode, and an electron and a hole are injected into the light emitting layer and recombined to form an exciton. The element emits light, utilizing light (fluorescent light or phosphorescent light) generated by inactivation of the exciton, and the element can emit light by applying a relatively low voltage of several volts to several tens of volts. The element exhibits a wide viewing angle and a high visuality since the element is self-luminous. Further, the element is a thin, completely solid element, and therefore, the element is noted from the viewpoint of space saving and portability.

A practical organic EL element is required to emit light of high luminance with high efficiency at a lower power. For example, disclosed are: an element exhibiting higher luminance of emitting light with longer life in which stilbene derivatives, distyrylarylene derivatives or tristyrylarylene derivatives doped with a slight amount of a fluorescent compound are employed (for example, see Patent Document 1); an element which has an organic light emitting layer containing an 8-hydroxyquinoline aluminum complex as a host compound doped with a slight amount of a fluorescent compound (for example, see Patent Document 2); and an element which has an organic light emitting layer containing an 8-hydroxyquinoline aluminum complex as a host compound doped with a quinacridone type dye (for example, see Patent Document 3).

When light emitted through excited singlet state is used in the organic element disclosed in the above Patent Documents, the upper limit of the external quantum efficiency (next) is considered to be at most 5%, because the generation probability of excited species capable of emitting light is 25%, since the generation ratio of singlet excited species to triplet excited species is 1:3, and further, external light emission efficiency is 20%.

Since an organic EL element, employing phosphorescence through the excited triplet, was reported by Princeton University (for example, see Non-Patent Document 1), studies on materials emitting phosphorescence at room temperature have been actively carried out (for example, see Non-Patent Document 2 and Patent Document 5). As the upper limit of the internal quantum efficiency of the excited triplet is 100%, the light emission efficiency of the exited triplet is theoretically four times that of the excited singlet. Accordingly, light emission employing the excited triplet exhibits almost the same performance as a cold cathode tube, and can be applied to illumination.

In "The 10th International Workshop on Inorganic and Organic Electroluminescence (EL '00, Hamamatsu)", papers on phosphorescent compounds have been reported. For example, Ikai et al. have reported a phosphorescent compound in which a hole transporting material had been used as a host material. M. E. Thompson et al. have reported a phosphorescent compound of which the host material has been doped with a novel iridium complex compound. Tsutsui et al. have reported an organic EL element exhibiting high luminance by employing a hole blocking layer (an exciton blocking layer). Other examples of a hole blocking layer include: a hole blocking layer in which a five coordinate aluminum complex is employed (for example, see Patent Documents 5 and 6); and a hole blocking layer in which biscarbazole derivative is employed (for example, see Patent Document 7). Ikai et al. have attained a high efficiency organic EL element employing a fluorine substituted compound as a hole blocking layer (an exciton blocking layer).

However, luminance, emission efficiency and life of the organic EL elements, produces so far, have not been fully satisfactory.

Since a single emission material emitting white light has not been developed, white light is obtained by emitting and mixing plural colors of light using plural emission materials. Examples of a combination of colors to obtain white light include: a combination of three maximum emission wavelengths of three primary colors, namely, blue, green and red; and a combination of a pair of maximum emission wavelengths of two complementary colors, for example, blue-yellow and blue green-orange. Since blue light is used in each combination of colors, a high luminance, high emission efficiency and long life white emission has not been fully attained.

The present invention was achieved under the above situations. An object of the present invention is to provide an organic electroluminescent element exhibiting high luminance, high emission efficiency and long life, and to also provide an illumination and a display employing the organic electroluminescent element.

Patent Document 1: Japanese Pat. No. 3093796
Patent Document 2: Japanese Patent Publication Open to Public Inspection (hereafter referred to as JP-A) No. 63-264692
Patent Document 3: JP-A No. 3-255190
Patent Document 4: JP-A No. 2000-21572
Patent Document 5: JP-A No. 2001-284056
Patent Document 6: JP-A No. 2002-8860
Patent Document 7: JP-A No. 2003-31371
Non-Patent Document 1: M. A. Baldo et al., Nature, 395, 151-154 (1998)
Non-Patent Document 2: M. A. Baldo et al., Nature, 403 (17), 750-753 (2000)
Non-Patent Document 3: Appl. Phys. Lett., 79, 156 (2001)

SUMMARY OF THE INVENTION

The above object of the present invention is achieved by the following structures.

(1) An organic electroluminescent element comprising an anode and a cathode having therebetween an emission layer containing a phosphorescent compound and an layer adjacent to the emission layer, the layer adjacent to the emission layer being provided between the emission layer and the cathode, wherein
the layer adjacent to the emission layer comprises a compound having an electron withdrawing group; and exhibiting a HOMO level of −5.7 to −7.0 eV and a LUMO level of −1.3 to −2.3 eV.

(2) The organic electroluminescent element of Item (1), wherein the compound exhibits a HOMO level of −5.9 to −6.8 eV and a LUMO level of −1.6 to −2.1 eV.

(3) The organic electroluminescent element of Item (1) or Item (2), wherein the electron withdrawing group is at least one of —$CF_3$, —F, —CN and —$SO_2R$, R representing an alkyl group.

(4) The organic electroluminescent element of any one of Items (1) to (3), wherein the organic electroluminescent element emits blue light.

(5) The organic electroluminescent element of any one of Items (1) to (3), wherein the organic electroluminescent element emits white light.

(6) A display comprising the organic electroluminescent element of any one of Items (1) to (5).

(7) An illumination comprising the organic electroluminescent element of any one of Items (1) to (5).

(8) A display comprising the illumination of Item (7) and a liquid crystal cell as a display means.

BEST MODE TO CARRY OUT THE INVENTION

Figure 1:
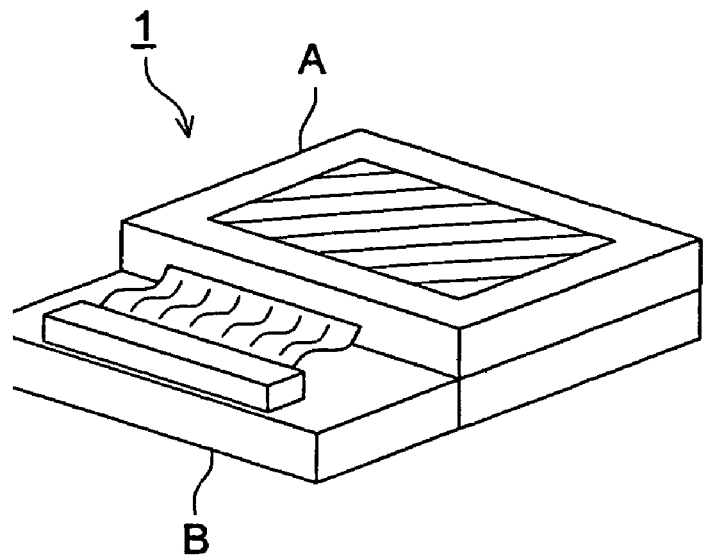
FIG. 1 is a schematic drawing of one example of a display containing an organic EL element.

The present invention will now be detailed.
In the present invention, an organic electroluminescent (EL) element exhibiting high luminance, high emission efficiency and long life has found to be obtained by an organic electroluminescent element containing an anode and a cathode having therebetween an emission layer containing a phosphorescent material and an adjacent layer to the emission layer, the adjacent layer being provided between the emission layer and the cathode, wherein the adjacent layer contains a compound having an electron withdrawing group; and the compound exhibits a HOMO level of −5.7 to −7.0 eV and a LUMO level of −1.3 to −2.3 eV.

Namely, in the above adjacent layer containing a compound having an electron withdrawing group, the compound exhibiting a HOMO level of −5.7 to −7.0 eV and a LUMO level of −1.3 to −2.3 eV, the cation radical of the molecule itself of the compound is stabilized and the adjacent layer exhibits a high effect of blocking electron holes. Further, by providing the adjacent layer between the emission layer and the cathode, an organic EL element exhibiting higher luminance, higher emission efficiency and longer life compared to those of conventional organic EL elements have been obtained.

The compound of the present invention contains an electron withdrawing group, where "an electron withdrawing group" is defined as a group of which Hammett substituent constant σp is larger than zero. The Hammett σp value is a substituent constant determined from the electronic effect of the substituent exerted on hydrolysis of ethyl benzoate by Hammett et al. Hammett substituent constants are listed in detail in, for example, "Structure-Activity Relationship of the Drug (Yakubutsu no Kouzou-Kassei Soukan))" (Nankodo Co., Ltd.: 1979).

Specific examples of an electron withdrawing group include: halogen atoms (for, example, a fluorine atom), a cyano group, a nitro group, a polyhaloalkyl group such as a trifluoromethyl group, a polyhaloaryl group such as a pentachlorophenyl group, a formyl group, an alkyl or aryl carbonyl group, a carbamoyl group, an alkyl or aryl sulfinyl group, an alkyl or aryl sulfonyl group, an alkyl or aryl sulfonyloxy group, a sulfamoyl group, a phospheno group, a phosphine oxide group, a phosphonate group, a phosphonic acid amide group and an arylazo group. These groups may further have a substituent.

In the present invention, the electron withdrawing group is preferably at least one of —$CF_3$, —F, —CN, and —$SO_2R$ and is most preferably —$CF_3$, wherein R represents an alkyl group or an aryl group, whereby an organic EL element exhibiting higher luminance, higher emission efficiency and longer life is obtained.

In the present invention, the value of a HOMO level or a LUMO level is defined as a value calculated by using a molecular orbital calculating software: Gaussian98 (Gaussian98, Revision A.11.4, M. J. Frisch, et al., Gaussian, Inc., Pittsburgh, Pa., 2002). In the calculation, structural optimization is carried out by using B3LYP/6-31G* as a keyword and the obtained value (in eV) is rounded off to the nearest tenth.

The values determined by this method were used because these values exhibited a high correlation between the calculated values and experimentally observed values.

In the present invention, the HOMO level of the compound is more preferably −5.9 to −6.8 eV and the LUMO level of the compound is more preferably −1.6 to −2.1 eV, whereby an organic EL element exhibiting higher luminance, higher emission efficiency and longer life is obtained.

The compound of the present invention is preferably a compound represented by Formula (1).

Formula (1)

Formula (1) contains at least one electron withdrawing group in the molecule. $Ar_1$-$Ar_3$ each represent an aryl group which may have a substituent. The electron withdrawing group is preferably at least one of —$CF_3$, —F, —CN, and —$SO_2R$ and is most preferably —$CF_3$, whereby an organic EL element exhibiting higher luminance, higher emission efficiency and longer life is obtained. The electron withdrawing group is preferably introduced in an aryl group, whereby an organic EL element exhibiting higher luminance, higher emission efficiency and longer life is obtained.

The compound of the present invention is preferably a compound represented by Formula (2).

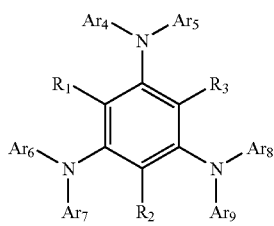

Formula (2)

Formula (2) contains at least one electron withdrawing group in the molecule. $Ar_4$-$Ar_9$ each represent an aryl group which may have a substituent. $R_1$-$R_3$ each independently represent a hydrogen atom or a substituent. The electron withdrawing group is preferably at least one of —$CF_3$, —F, —CN, and —$SO_2R$ and is most preferably —$CF_3$, whereby an organic EL element exhibiting higher luminance, higher emission efficiency and longer life is obtained. The electron withdrawing group is preferably introduced in an aryl group, whereby an organic EL element exhibiting higher luminance, higher emission efficiency and longer life is obtained.

The compound of the present invention is preferably a compound represented by Formula (3).

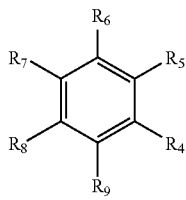

Formula (3)

Formula (3) contains at least one electron withdrawing group in the molecule. $R_4$-$R_9$ each independently represent a hydrogen atom or a substituent. The electron withdrawing group is preferably at least one of —$CF_3$, —F, —CN, —$SO_2R$ and is most preferably —$CF_3$, whereby an organic EL element exhibiting higher luminance, higher emission efficiency and longer life is obtained. The electron withdrawing group is preferably introduced in an aryl group, whereby an organic EL element exhibiting higher luminance, higher emission efficiency and longer life is obtained.

The compound of the present invention is preferably a compound represented by Formula (4).

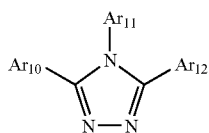

Formula (4)

Formula (4) contains at least one electron withdrawing group in the molecule. $Ar_{10}$-$Ar_{12}$ each represent an aryl group which may have a substituent. The electron withdrawing group is preferably at least one of —$CF_3$, —F, —CN, and —$SO_2R$ and is most preferably —$CF_3$, whereby an organic EL element exhibiting higher luminance, higher emission efficiency and longer life is obtained. The electron withdrawing group is preferably introduced in an aryl group, whereby an organic EL element exhibiting higher luminance, higher emission efficiency and longer life is obtained.

The compound of the present invention is preferably a compound represented by Formula (5).

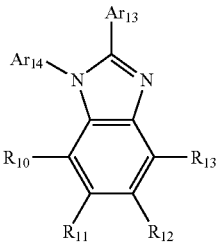

Formula (5)

Formula (5) contains at least one electron withdrawing group in the molecule. $Ar_{13}$ and $Ar_{14}$ each represent an aryl group which may have a substituent. $R_{10}$-$R_{13}$ each independently represent a hydrogen atom or a substituent. The electron withdrawing group is preferably at least one of —$CF_3$, —F, —CN, and —$SO_2R$ and is most preferably —$CF_3$, whereby an organic EL element exhibiting higher luminance, higher emission efficiency and longer life is obtained. The electron withdrawing group is preferably introduced in an aryl group, whereby an organic EL element exhibiting higher luminance, higher emission efficiency and longer life is obtained.

The compound of the present invention is preferably a compound represented by Formula (6).

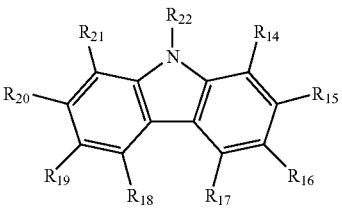

Formula (6)

Formula (6) contains at least one electron withdrawing group in the molecule. $R_{14}$-$R_{22}$ each independently represent a hydrogen atom or a substituent. The electron withdrawing group is preferably at least one of —$CF_3$, —F, —CN, and —$SO_2R$ and is most preferably —$CF_3$, whereby an organic EL element exhibiting higher luminance, higher emission efficiency and longer life is obtained. The electron withdrawing group is preferably introduced in an aryl group, whereby an organic EL element exhibiting higher luminance, higher emission efficiency and longer life is obtained.

The compound of the present invention is preferably a compound represented by Formula (7).

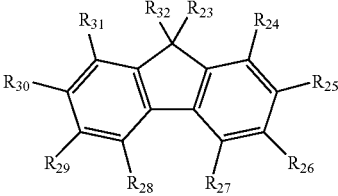

Formula (7)

Formula (7) contains at least one electron withdrawing group in the molecule. $R_{23}$-$R_{32}$ each independently represent a hydrogen atom or a substituent. The electron withdrawing group is preferably at least one of —$CF_3$, —F, —CN, and —$SO_2R$ and is most preferably —$CF_3$, whereby an organic EL element exhibiting higher luminance, higher emission efficiency and longer life is obtained. The electron withdrawing group is preferably introduced in an aryl group, whereby an organic EL element exhibiting higher luminance, higher emission efficiency and longer life is obtained.

The compound of the present invention is preferably a compound represented by Formula (8).

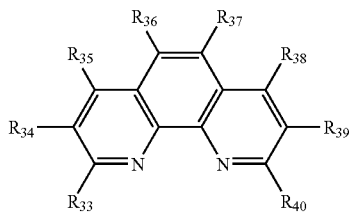

Formula (8)

Formula (8) contains at least one electron withdrawing group in the molecule. $R_{33}$-$R_{40}$ each independently represent a hydrogen atom or a substituent. The electron withdrawing group is preferably at least one of —$CF_3$, —F, —CN, and —$SO_2R$ and is most preferably —$CF_3$, whereby an organic EL element exhibiting higher luminance, higher emission efficiency and longer life is obtained. The electron withdrawing group is preferably introduced in an aryl group, whereby an organic EL element exhibiting higher luminance, higher emission efficiency and longer life is obtained.

The compound of the present invention is preferably a compound represented by Formula (9).

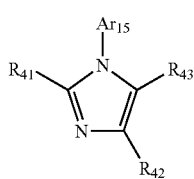

Formula (9)

Formula (9) contains at least one electron withdrawing group in the molecule. $Ar_{15}$ represents an aryl group which may have a substituent. $R_{41}$-$R_{43}$ each independently represent a hydrogen atom or a substituent. The electron withdrawing group is preferably at least one of —$CF_3$, —F, —CN, and —$SO_2R$ and is most preferably —$CF_3$, whereby an organic EL element exhibiting higher luminance, higher emission efficiency and longer life is obtained. The electron withdrawing group is preferably introduced in an aryl group, whereby an organic EL element exhibiting higher luminance, higher emission efficiency and longer life is obtained.

The compound of the present invention is preferably a compound represented by Formula (10).

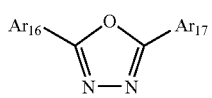

Formula (10)

Formula (10) contains at least one electron withdrawing group in the molecule. $Ar_{16}$ and $Ar_{17}$ each represent an aryl group which may have a substituent. The electron withdrawing group is preferably at least one of —$CF_3$, —F, —CN, and —$SO_2R$ and is most preferably —$CF_3$, whereby an organic EL element exhibiting higher luminance, higher emission efficiency and longer life is obtained. The electron withdrawing group is preferably introduced in an aryl group, whereby an organic EL element exhibiting higher luminance, higher emission efficiency and longer life is obtained.

The compound of the present invention is preferably a compound represented by Formula (11).

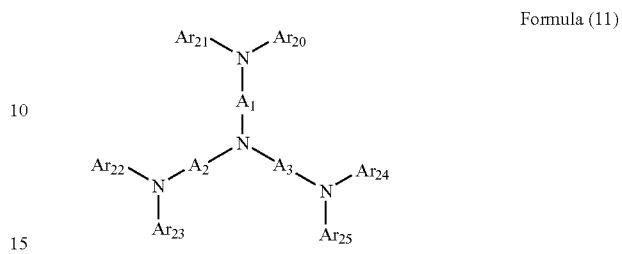

Formula (11)

Formula (11) contains at least one electron withdrawing group in the molecule. $Ar_{20}$-$Ar_{25}$ each represent an aryl group which may have a substituent. $A_1$-$A_3$ each represent an arylene group. The electron withdrawing group is preferably at least one of —$CF_3$, —F, —CN, and —$SO_2R$ and is most preferably —$CF_3$, whereby an organic EL element exhibiting higher luminance, higher emission efficiency and longer life is obtained. The electron withdrawing group is preferably introduced in an aryl group, whereby an organic EL element exhibiting higher luminance, higher emission efficiency and longer life is obtained.

The compound of the present invention is preferably a compound represented by Formula (12).

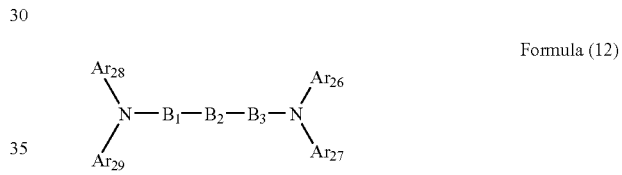

Formula (12)

Formula (12) contains at least one electron withdrawing group in the molecule. $Ar_{26}$-$Ar_{29}$ each represent an aryl group which may have a substituent. $B_1$ and $B_3$ each represent an arylene group, and $B_2$ represents a single bond or a divalent linking group. The electron withdrawing group is preferably at least one of —$CF_3$, —F, —CN, and —$SO_2R$ and is most preferably —$CF_3$, whereby an organic EL element exhibiting higher luminance, higher emission efficiency and longer life is obtained. The electron withdrawing group is preferably introduced in an aryl group, whereby an organic EL element exhibiting higher luminance, higher emission efficiency and longer life is obtained.

Examples of the aryl group in Formulas (1)-(12) include: a phenyl group, a naphthyl group, a biphenyl group and a fluorenyl group. The aryl groups may be substituted. Examples of a substituent of the aryl group include: electron-withdrawing groups (for example, —$CF_3$, —F, —CN, and —$SO_2R$); alkyl groups (for example, a methyl group, an ethyl group, an isopropyl group, a hydroxyethyl group, a methoxy methyl group and a t-butyl group); cycloalkyl groups (for example, a cyclopentyl group and a cyclohexyl group); a trifluoromethyl group; a pentafluorophenyl group, a cyano group, an alkylsulfonyl group (such as a methylsulfonyl group); halogen atoms (such as a fluorine atom); aryl groups (for example, a phenyl group, a naphthyl group, a p-tolyl group, a p-chlorophenyl group and a mesityl group); a heteroaryl group; and an alkoxy group (such as a methoxy group). As a substituent of an aryl group, a phenyl group is preferable, and a triarylamine derivative is preferably a triphenylamine derivative.

In the present invention, examples of a substituent include: alkyl groups (for example, a methyl group, an ethyl group, a propyl group, an isopropyl group, a tert-butyl, a pentyl group, a hexyl group, an octyl group, a dodecyl group, a tridecyl group, a tetradecyl group and a pentadecyl group); cycloalkyl groups (for example, a cyclopentyl group and a cyclohexyl group); alkenyl groups (for example, a vinyl group and an allyl group); alkynyl groups (for example, an ethynyl group and, a propargyl group); aryl groups (for example, a phenyl group); heteroaryl groups (for example, a furyl group, a thienyl group, a pyridyl group, a pyridazinyl group, a pyrimidinyl group, a pyrazyl group, a triazyl group, an imidazolyl group, a pyrazolyl group, a thiazolyl group, a quinazolyl group and a phthalazyl group); heterocycle groups (for example, a pyrrolidyl group and an imidazolidyl group, a morpholyl group and oxazolidyl group); alkoxy groups (for example, a methoxy group, an ethoxy group, a propyloxy group, a pentyloxy group, a hexyloxy group, an octyloxy group and a dodecyl oxygroup); cycloalkoxy groups (for example, a cyclopentyloxy group and a cyclohexyloxy group); aryloxy groups (for example, a phenoxy group and a naphthyloxy group); alkylthio groups (for example, a methylthio group, an ethylthio group, a propylthio group, a pentylthio group, a hexylthio group, an octylthio group and a dodecyl thio group); cycloalkylthio groups (for example, a cyclopentylthio group and a cyclohexylthio group); arylthio groups (For example, a phenylthio group and a naphthylthio group), and alkoxycarbonyl groups (for example, a methyloxycarbonyl group, an ethyloxycarbonyl group, a butyloxycarbonyl group, an octyloxycarbonyl group and a dodecyl oxycarbonyl group); aryloxycarbonyl groups (for example, a phenyloxycarbonyl group and a naphthyloxycarbonyl group); sulfamoyl groups (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group and 2-pyridylaminosulfonyl group); acyl groups (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group and a pyridylcarbonyl group); acyloxy groups (for example, an acetyloxy group, an ethylcarbonyloxy group, and a butylcarbonyloxy group, an octylcarbonyloxy group, a dodecylcarbonyloxy group and a phenylcarbonyloxy group);

amide groups (for example, a methylcarbonylamino group and an ethylcarbonylamino group, a dimethylcarbonylamino group, a propylcarbonylamino group, a pentylcarbonylamino group, a cyclohexylcarbonylamino group, 2-ethylhexylcarbonylamino group, an octylcarbonylamino group, a dodecylcarbonylamino group, a phenylcarbonylamino group and a naphthylcarbonylamino group); carbamoyl groups (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, 2-ethylhexylaminocarbonyl group, a dodecylaminocarbonyl group, a phenylaminocarbonyl group, a naphthylaminocarbonyl and a 2-pyridylaminocarbonyl group); ureido groups (for example, a methylureido group, an ethylureido group, a pentylureido group, a cyclohexylureido group, an octylureido group, a dodecylureido group, a phenylureido group, a naphthylureido group and 2-pyridyl amino ureido group); sulfinyl groups (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group and 2-pyridylsulfinyl group); alkylsulfonyl groups (for example, a methylsulfonyl group, an ethylsulfonyl group, a butylsulfonyl group, a cyclohexylsulfonyl group, a 2-ethylhexylsulfonyl group and a dodecylsulfonyl group); arylsulfonyl groups (for example, a phenylsulfonyl group, a naphthylsulfonyl group and a 2-pyridylsulfonyl group); amino groups (for example, an amino group, an ethylamino group, a dimethylamino group, a butyl amino group, a cyclopentylamino group, a 2-ethylhexylamino group, a dodecylamino group, an anilino group, a naphthylamino group and a 2-pyridylamino group); halogen atoms (for example, a fluorine atom, a chlorine atom and a bromine atom); fluorohydrocarbon groups (for example, a fluoromethyl group, a trifluoromethyl group, a pentafluoroethyl group and a pentafluorophenyl group); and a cyano group; a nitro group; a hydroxyl group; a mercapto group; and silyl groups (for example, a trimethylsilyl group, a triisopropyl silyl group, a triphenylsilyl group and a phenyldiethylsilyl group).

Each of these substituents may further be substituted by an above-mentioned substituent.

As a substituent, a halogen atom, an alkyl group, an alkoxy group and an aryl group are preferable.

Specific examples of an arylene group contained in Formulas (11) and (12) of the present invention include: a phenylene group, a naphtylene group, an anthrylene group, a phenanthrenylene group, a pyrenylene group, a perylenylene group, a fluorenylene group, a biphenylene group, a terphenylene group, a rubrenylene group, a chrysenylene group, a triphenylenylene group, a benzoanthrylene group, a benzophenanthrenylene group and a diphenylanthrylene group. These arylene groups may further have a substituent mentioned above. Of these arylene groups, preferable are a phenylene group and a fluorenylene group.

Examples of a divalent linking group in Formula (12) of the present invention include: an arylene group, a heteroarylene group, a fluorenylene group, an alkylene group, an alkenylene group, an alkynylene group, —O—, —S—, —SO$_2$—, —N(R$_0$)— (R$_0$ representing an alkyl-group or an aryl group which may be substituted), and combination thereof.

Specific examples of the compound used in the present invention are shown below, however, the present invention is not limited thereto.

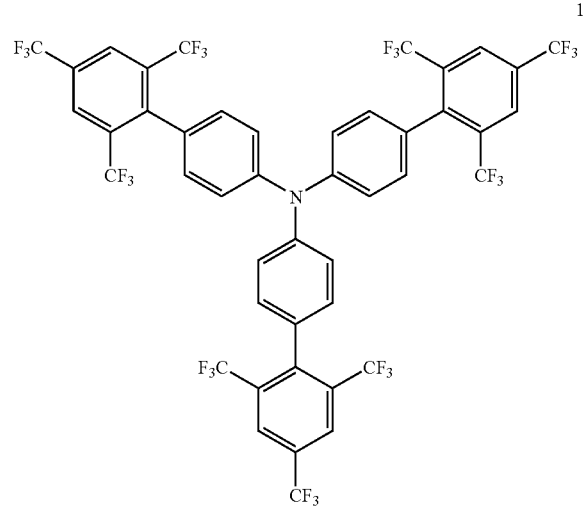

1

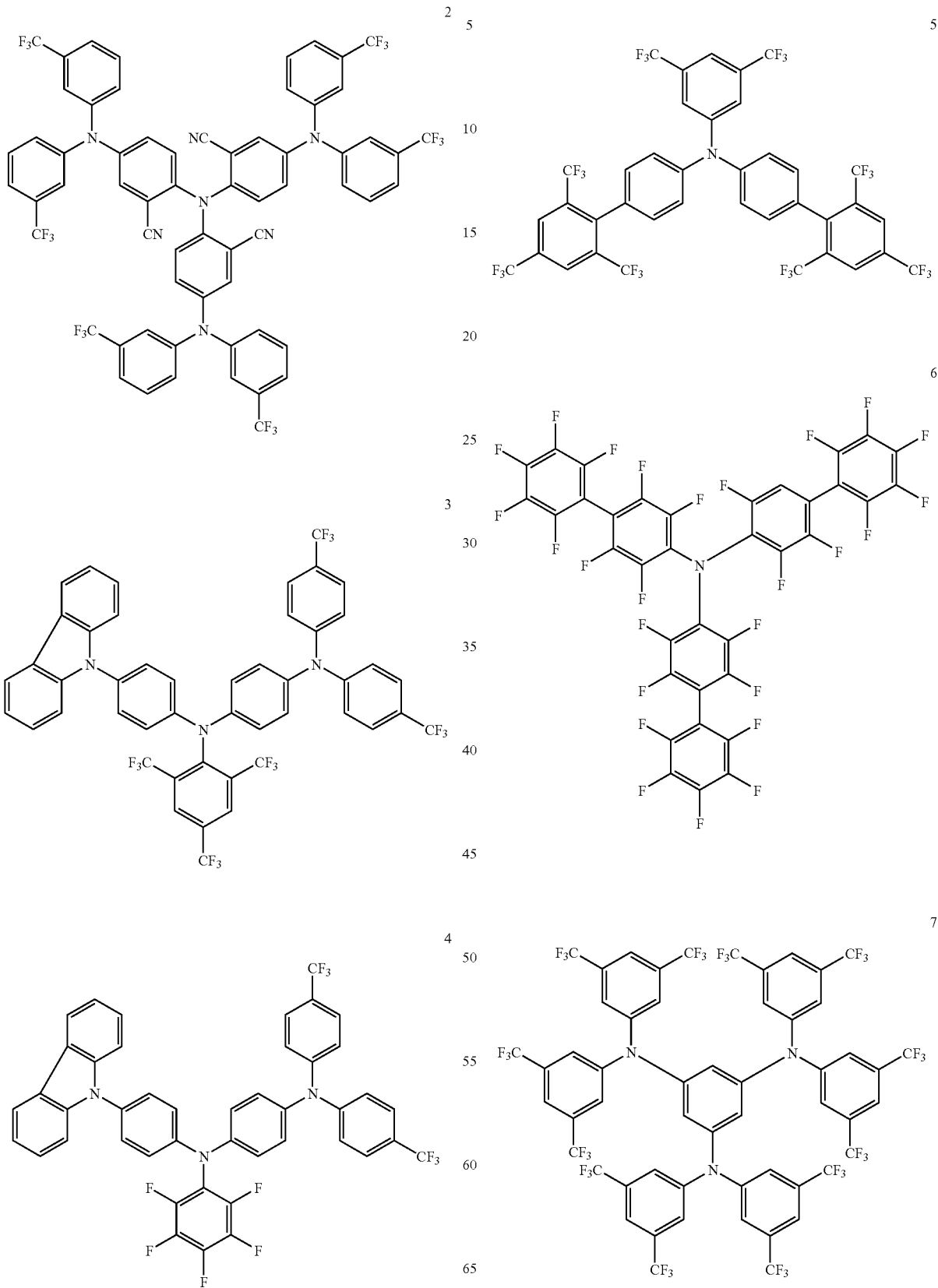

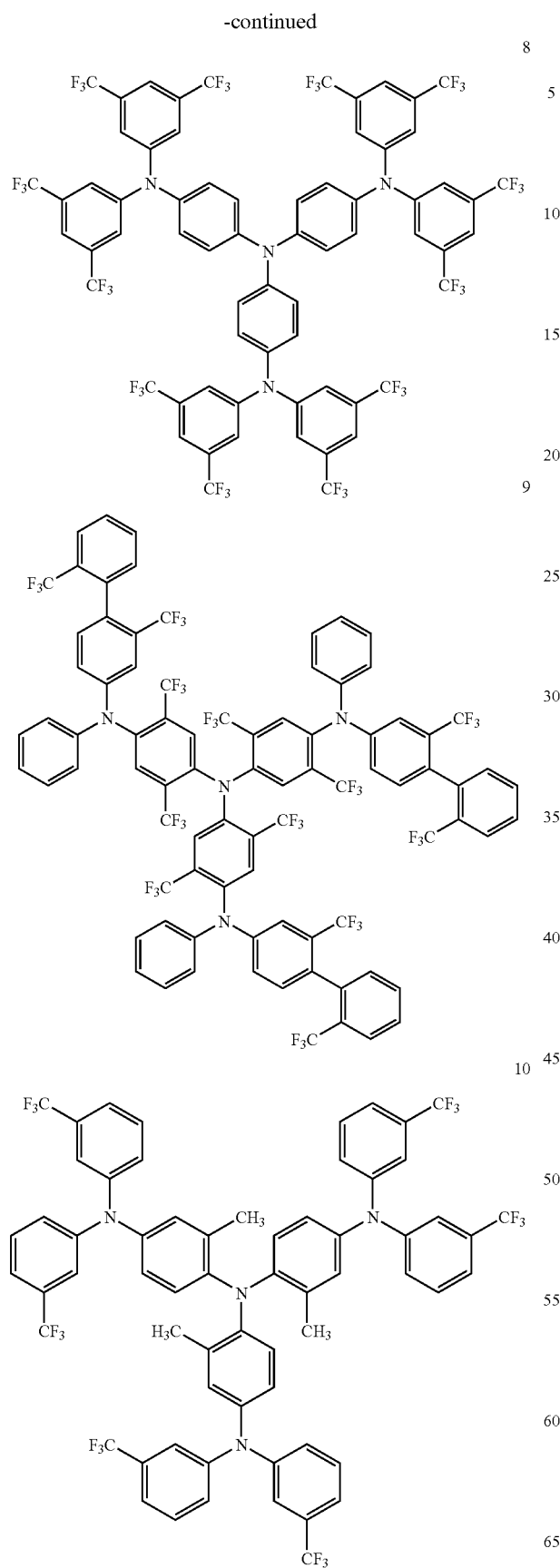
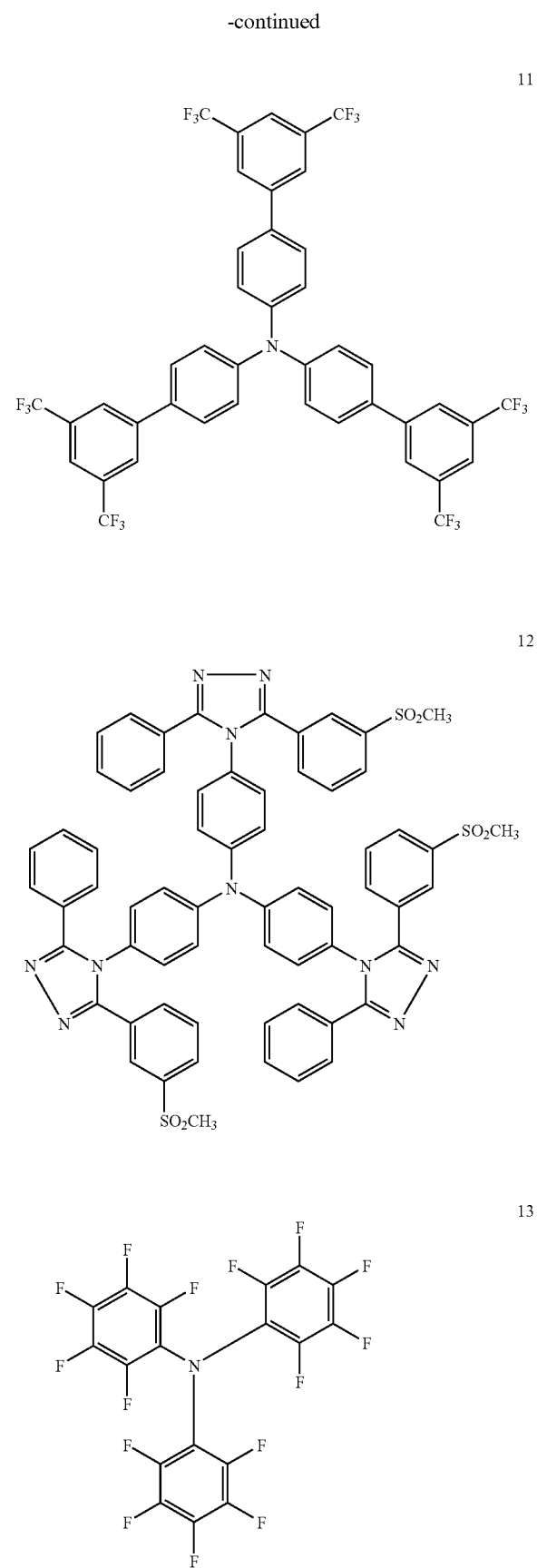

-continued
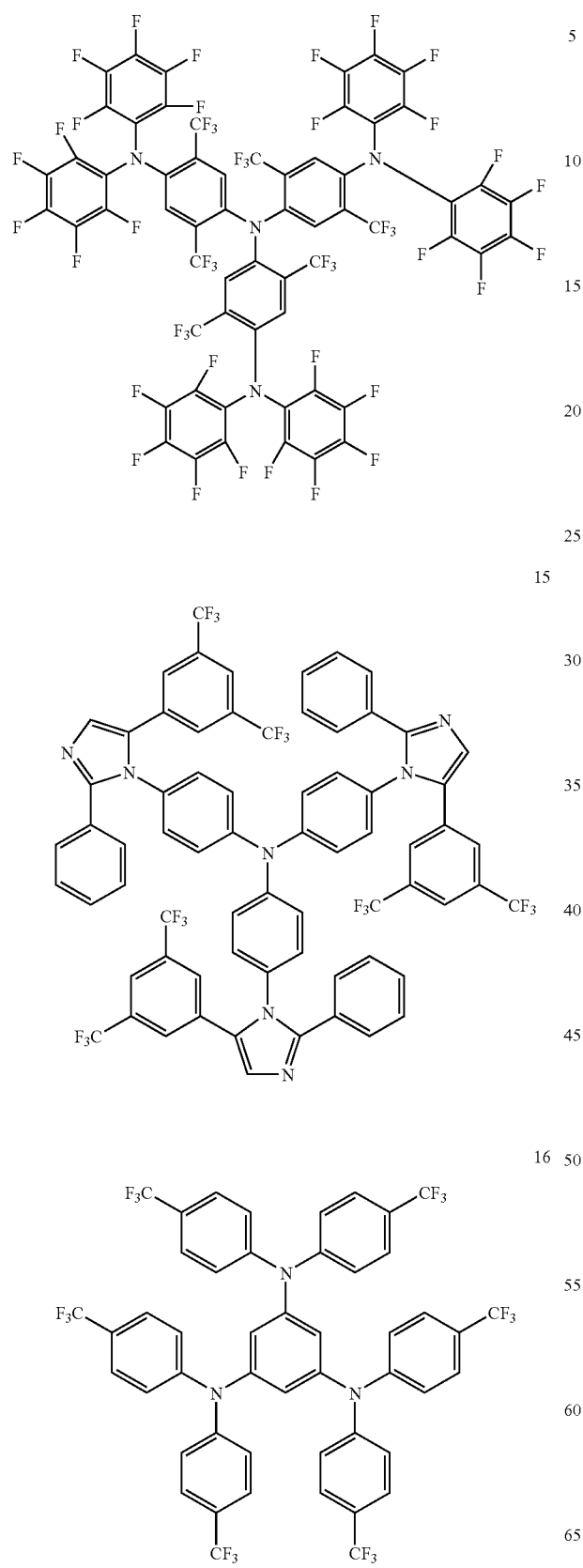
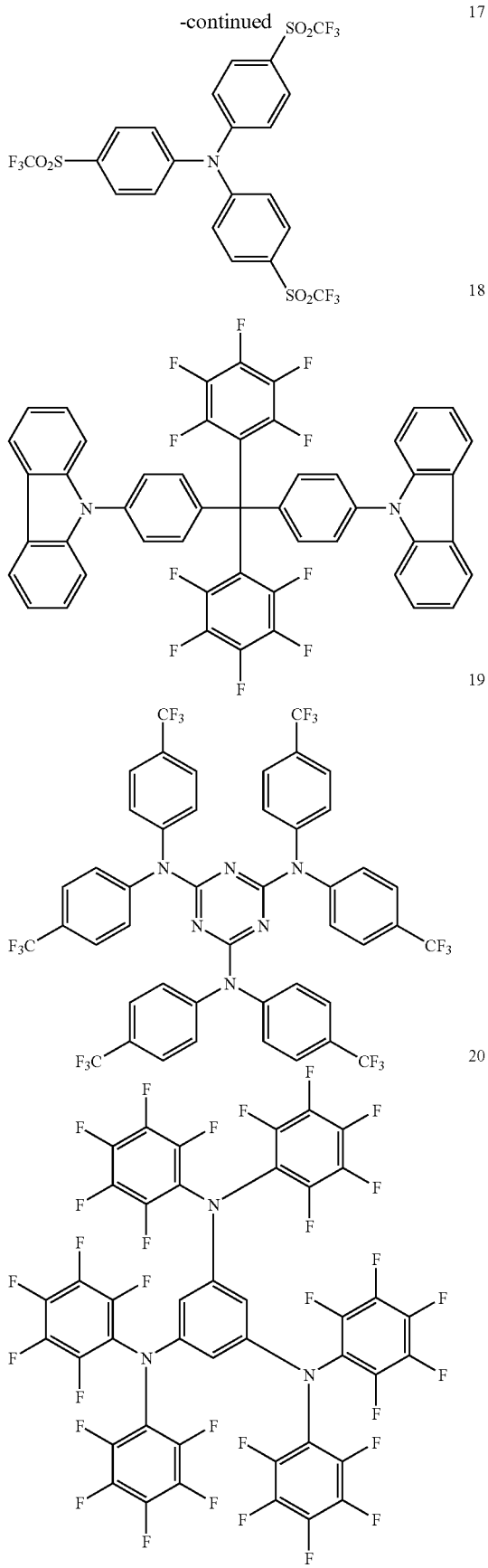

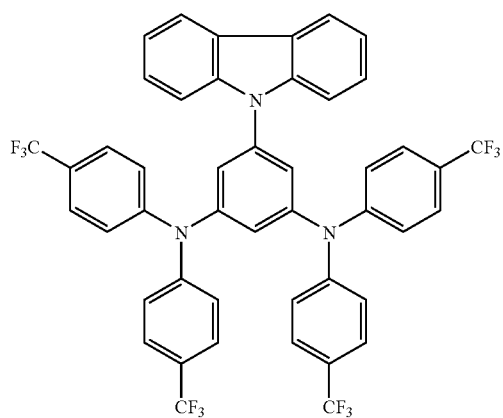
21
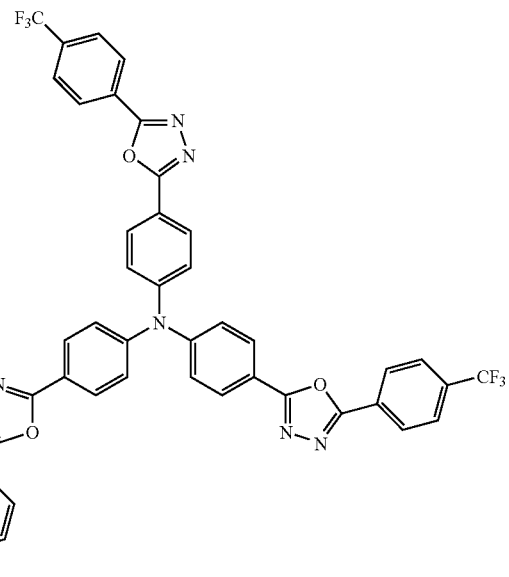
24
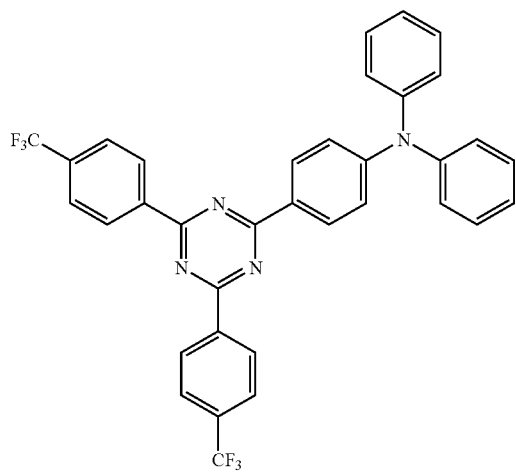
22
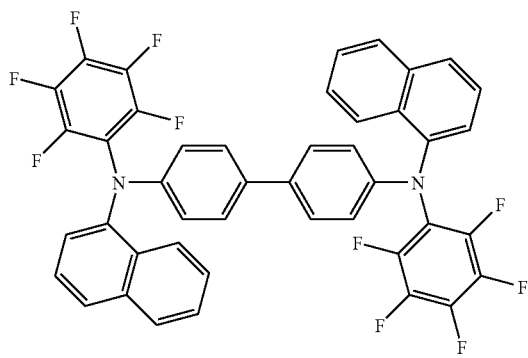
25
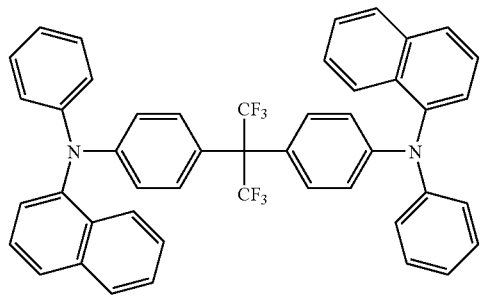
26
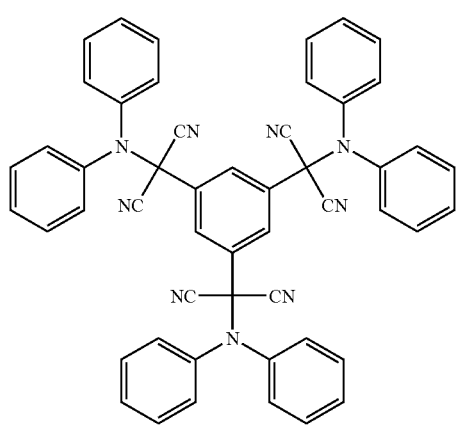
23
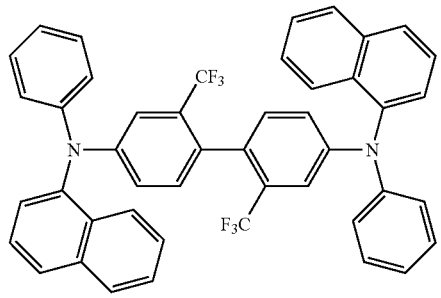
27

-continued
28
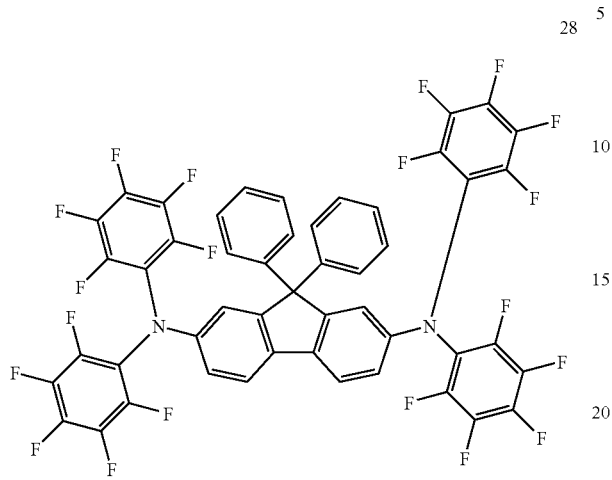
29
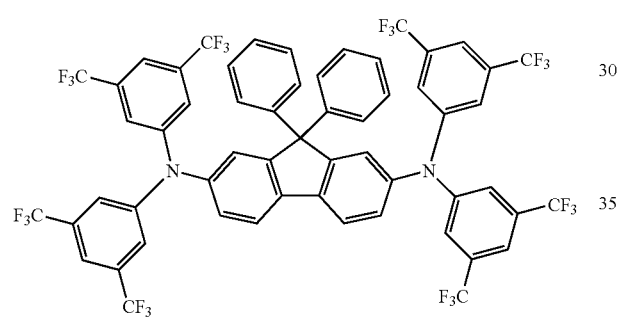
30
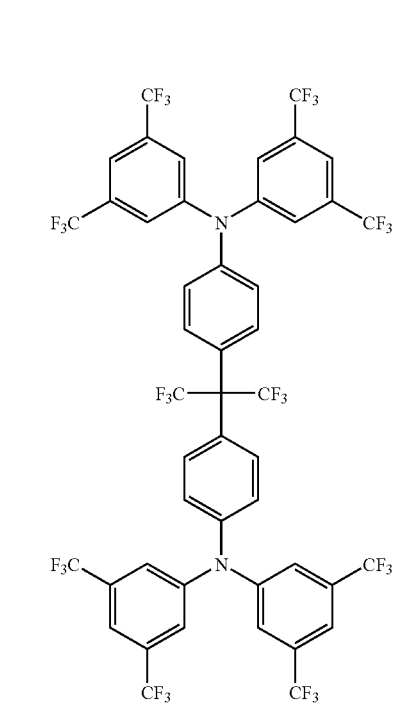
-continued
31
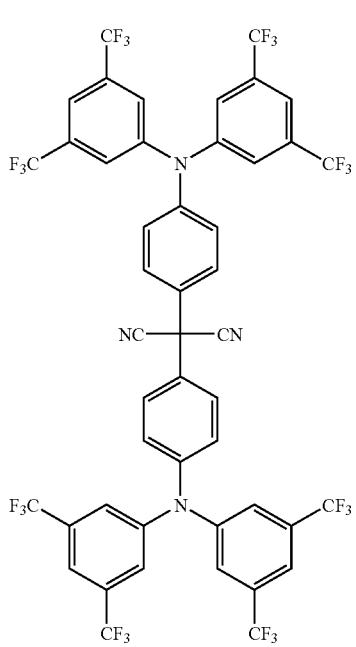
32
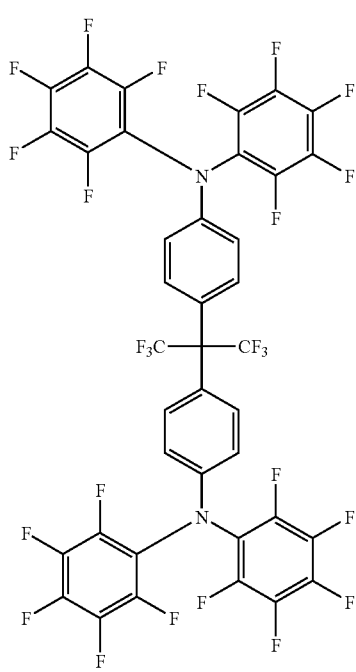

-continued
33
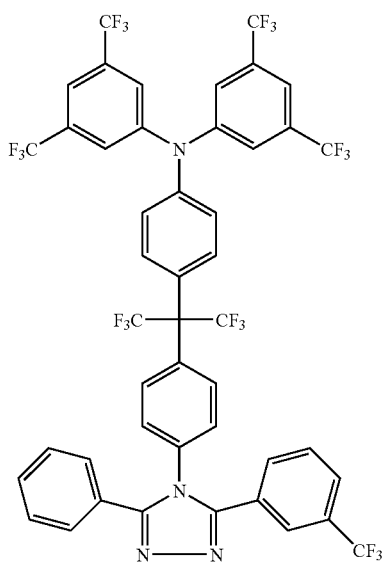
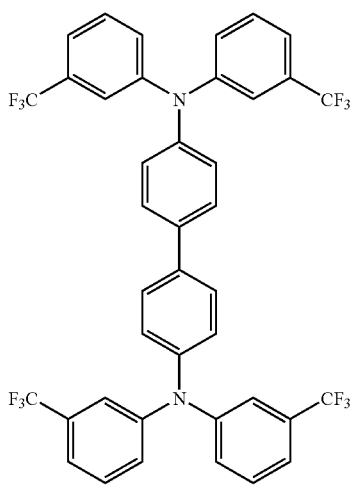
-continued
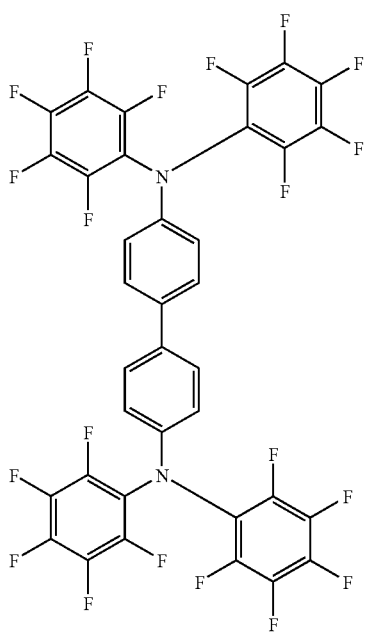
34
35
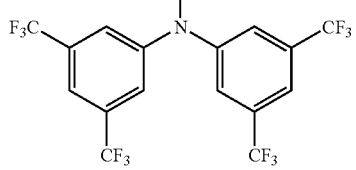
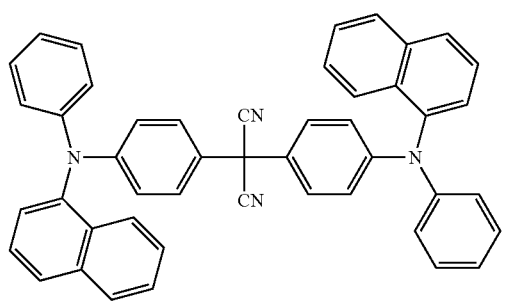

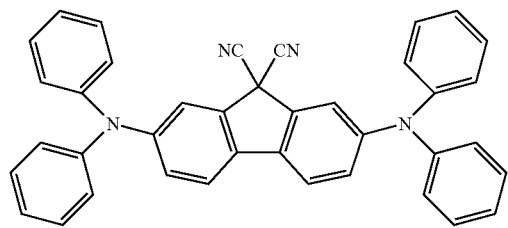
39
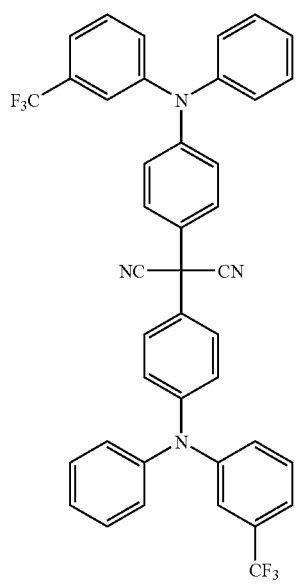
40
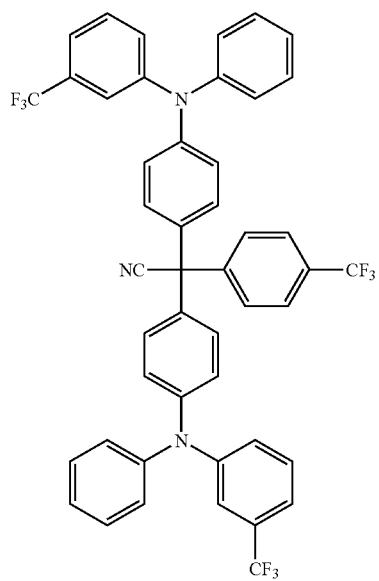
41
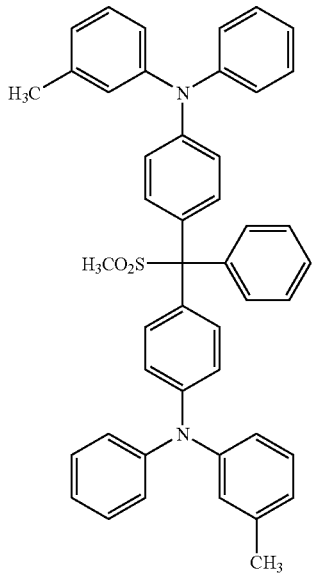
42
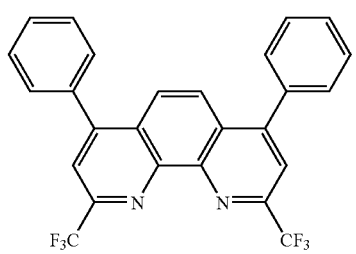
43
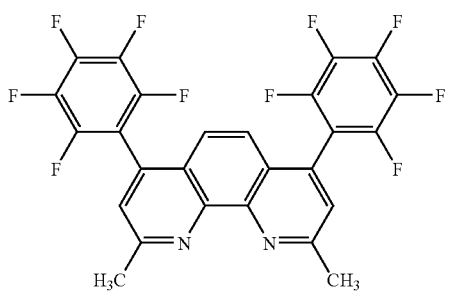
44
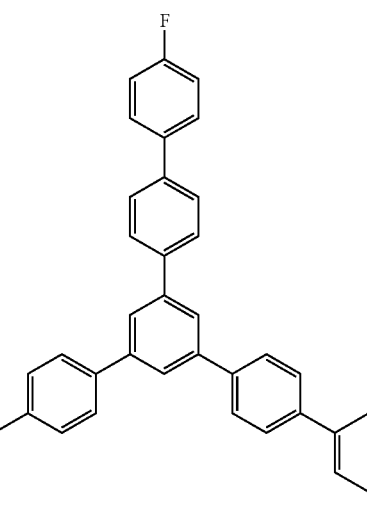
45

-continued
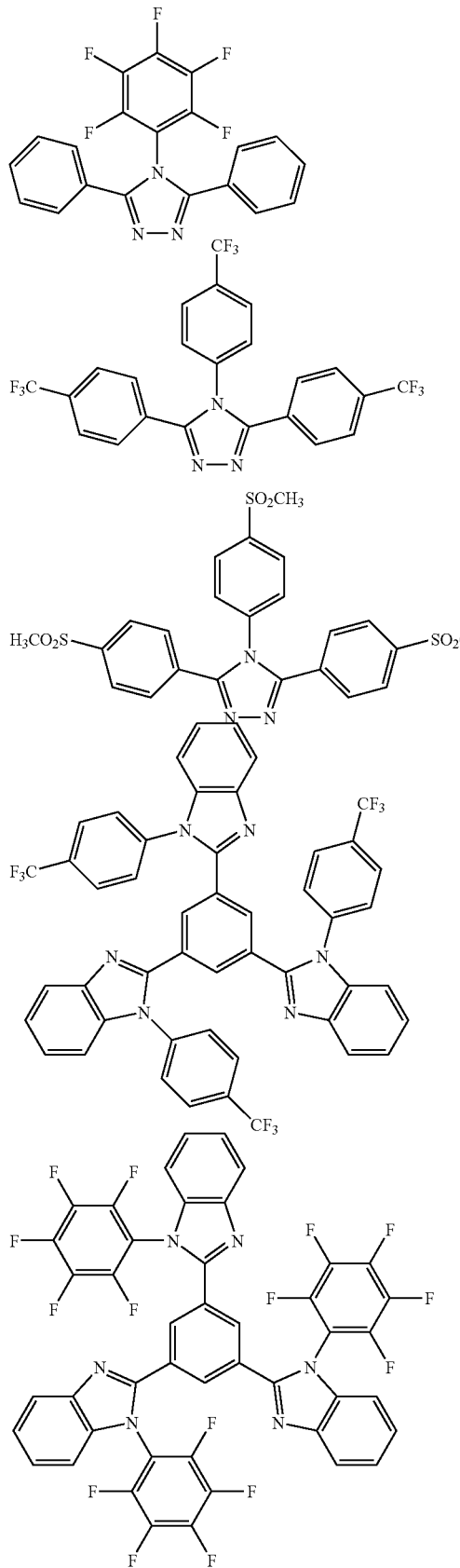
-continued
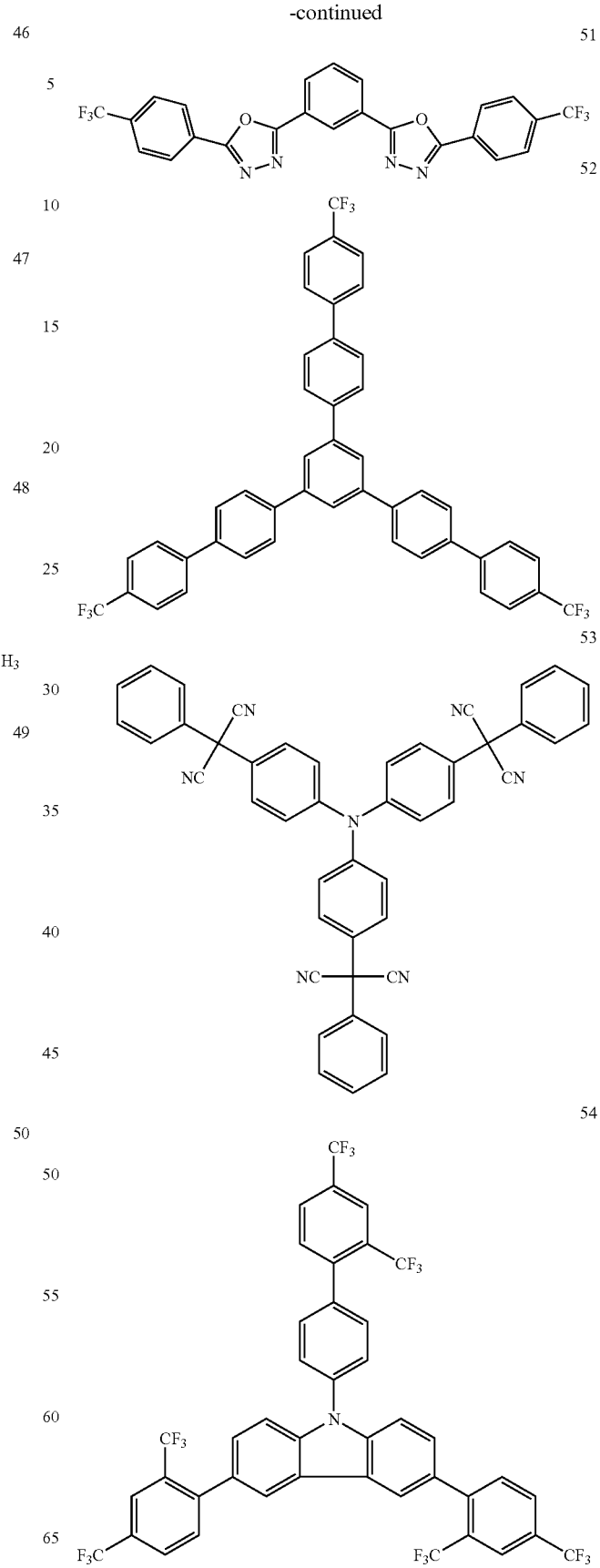

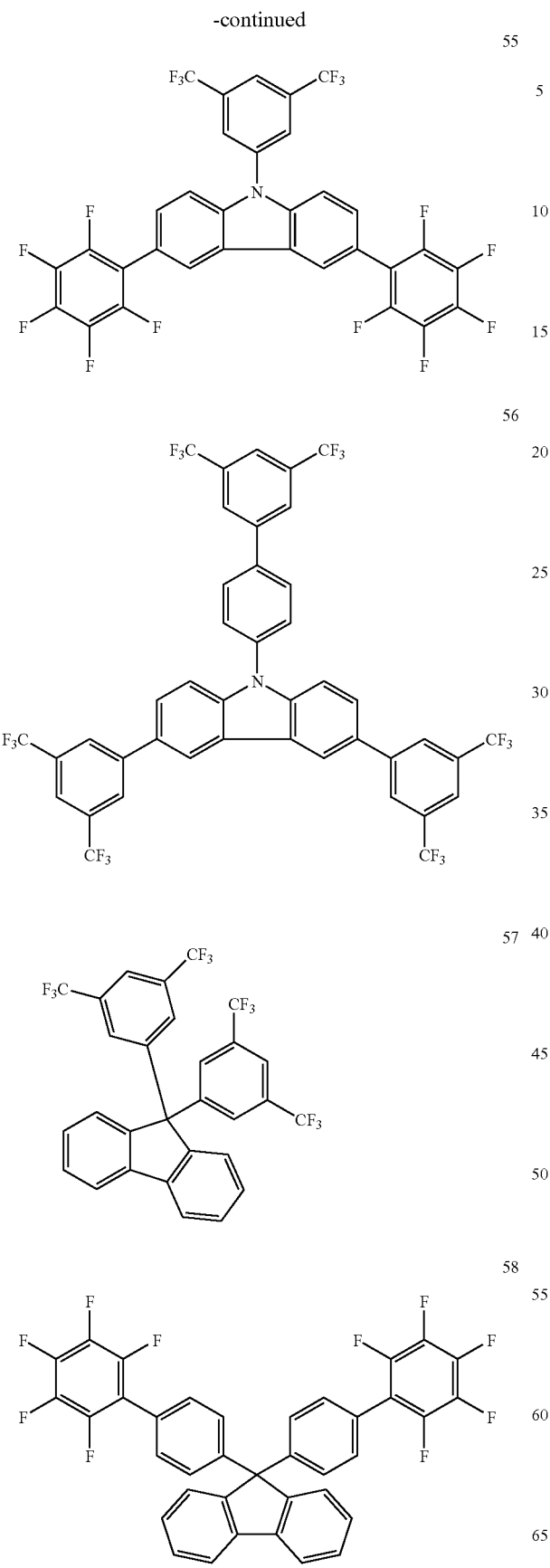

-continued

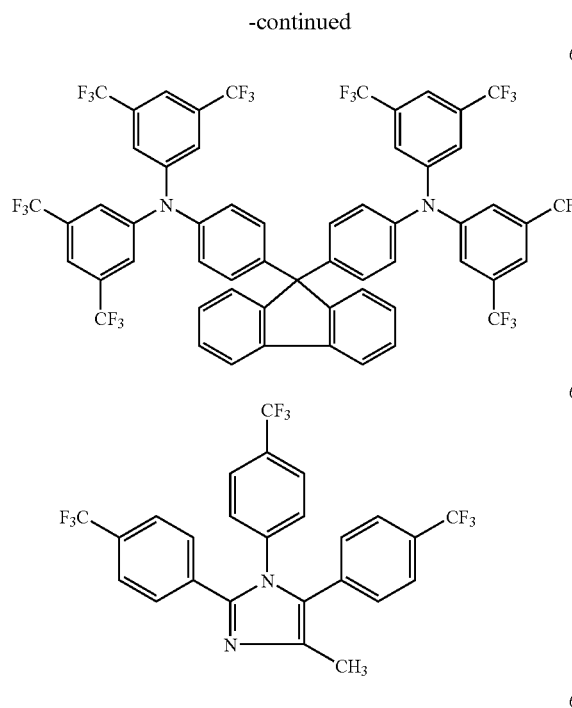

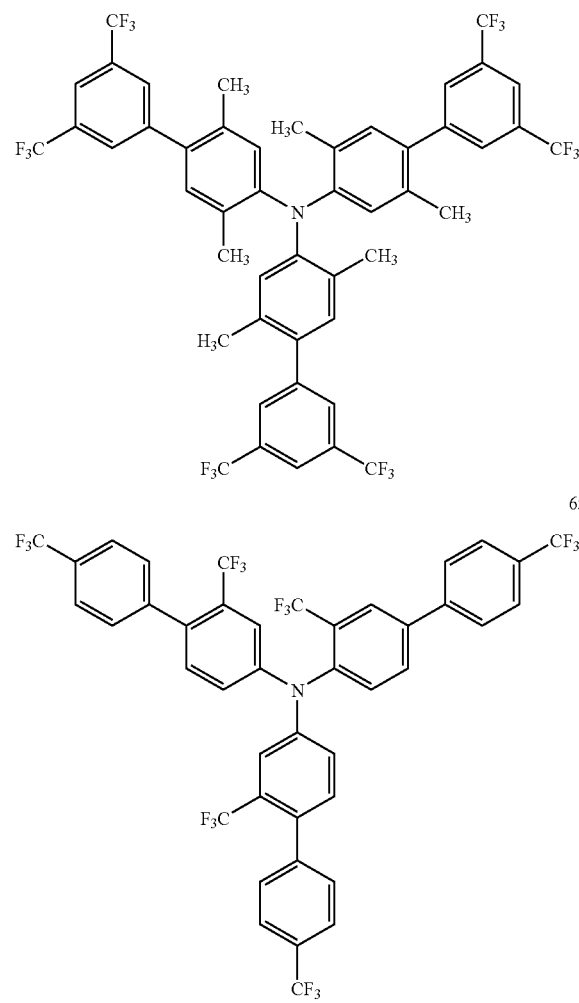

-continued

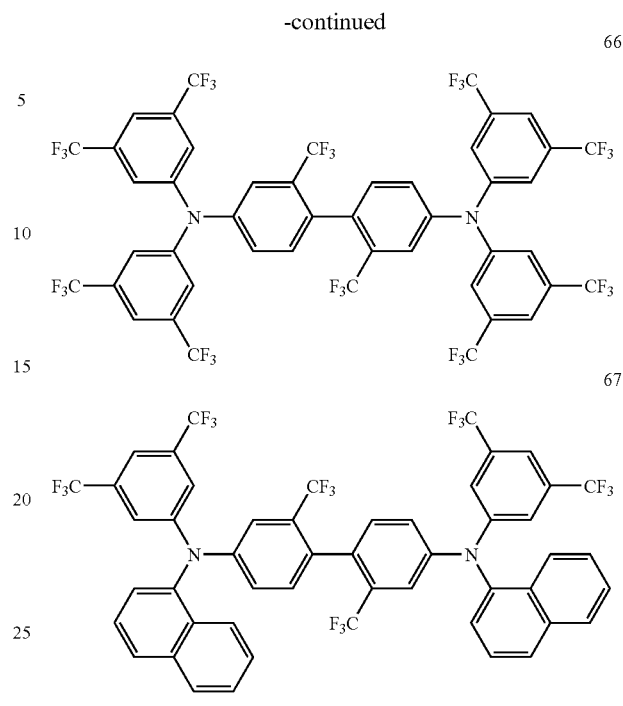

The compound used in the present invention preferably has a molecular weight of 450-1500, whereby the more effect of the present invention can be acquired.

The synthetic process of the above compound 30 will be described as an example of the synthetic process of the above-mentioned compound.

2.0 g of 2,2-bis(4-aminophenyl)-hexafluoropropane and 8.0 g of 3,5-bis(trifluoromethyl)iodobenzene were added to a xylene solvent and stirred while heating for 8 hours. In the reaction, palladium acetate and tri-tert-butylphosphine were used as catalysts and sodium-t-butoxide was used as a base. After the reaction was finished, ethylacetate, tetrahydrofuran, and water were added to the product to extract the organic layer. The organic layer was dried using magnesium sulfate, and the solvent was removed by vacuum evaporation. The product was refined by column chromatography and recrystallized in acetonitrile to obtain 2.2 g of the compound 30.

The emission layer of the present invention contains a phosphorescent compound, whereby high emission efficiency is attained.

The phosphorescent compound contained in the emission layer of the present invention can be suitably chosen from the compounds known in the art used for the emission layer of an organic EL element. Examples of dopant to the emission layer include: an iridium complex disclosed in the specification of JP-A No. 2001-247859; a compound represented by the formula described in pp 16-18 of the specification of WO00/70,655, for example, tris(2-phenylpyridine)iridium and an osmium complex; and a platinum complex, for example, 2,3,7,8,12,13,17,18-octaethyl-21H,23H-porphyrin platinum. By using such a phosphorescent compound as a dopant, an organic EL element exhibiting a high internal quantum efficiency is attained.

The phosphorescent compound used in the present invention is preferably a complex compound containing a metal of Group 8 in the periodic table, and is more preferably an iridium compound, an osmium compound, a platinum compound (a platinum complex compound) or a rare earth metal complex compound. Of these, further more preferable is an iridium compound.

Specific examples of the phosphorescent compound used in the present invention are shown below, however, the present invention is not limited thereto. These compounds can be synthesized according to the method, for example, described in Inorg. Chem., Vol. 40, pp 1704-1711.

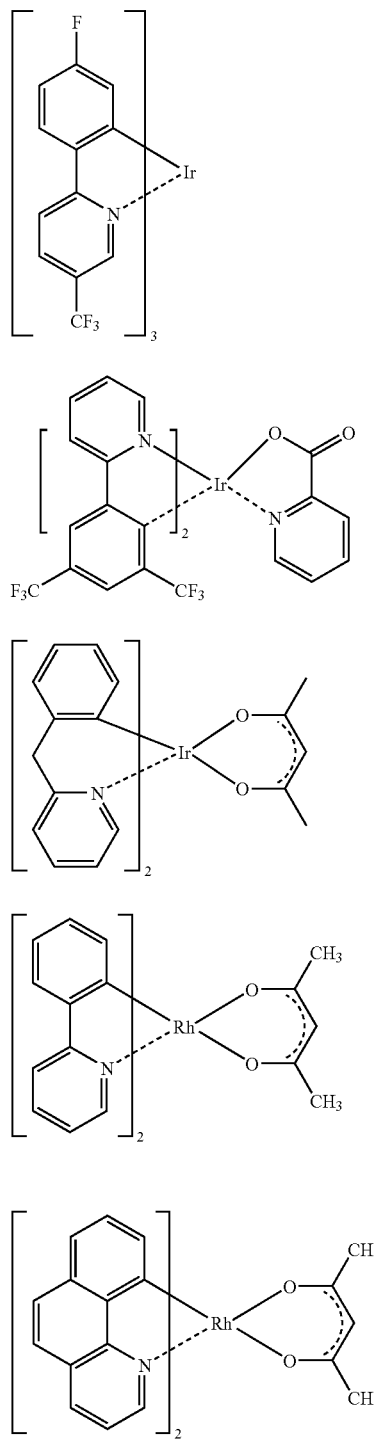
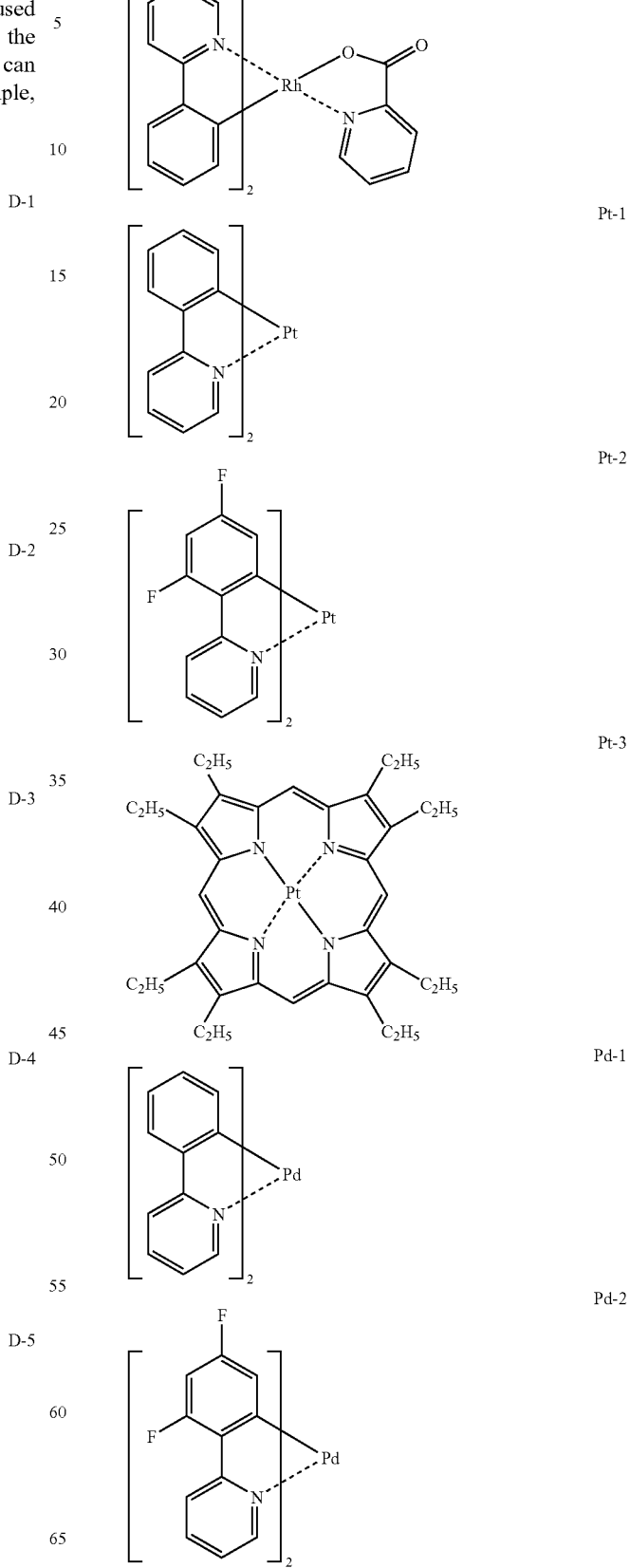

Pd-3
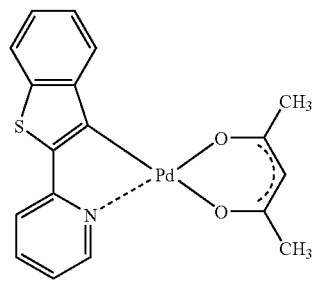
Rh-1
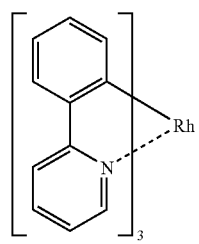
Rh-2
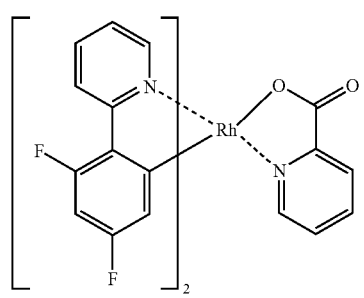
Rh-3
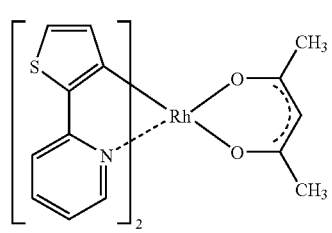
A-1
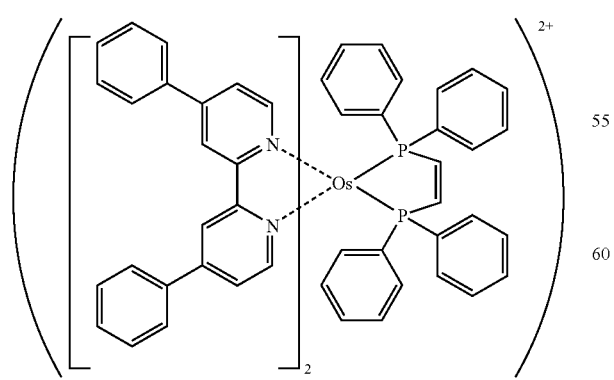
Ir-1
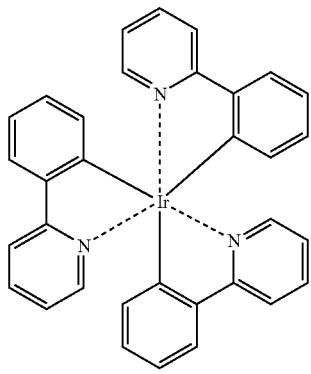
Ir-2
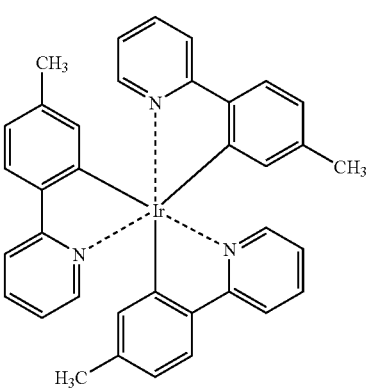
Ir-3
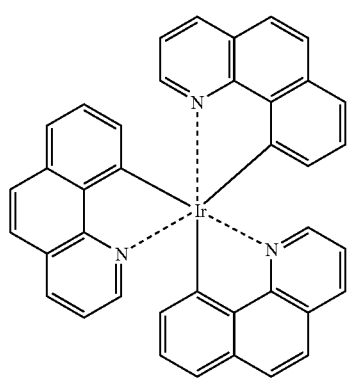
Ir-4
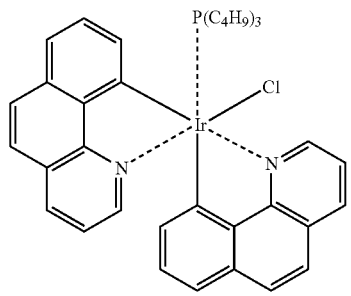

-continued

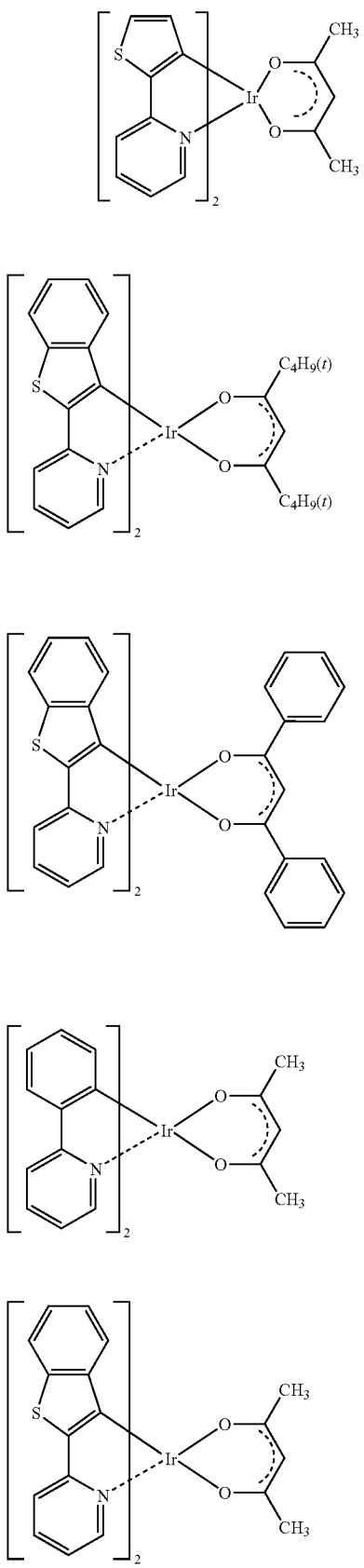

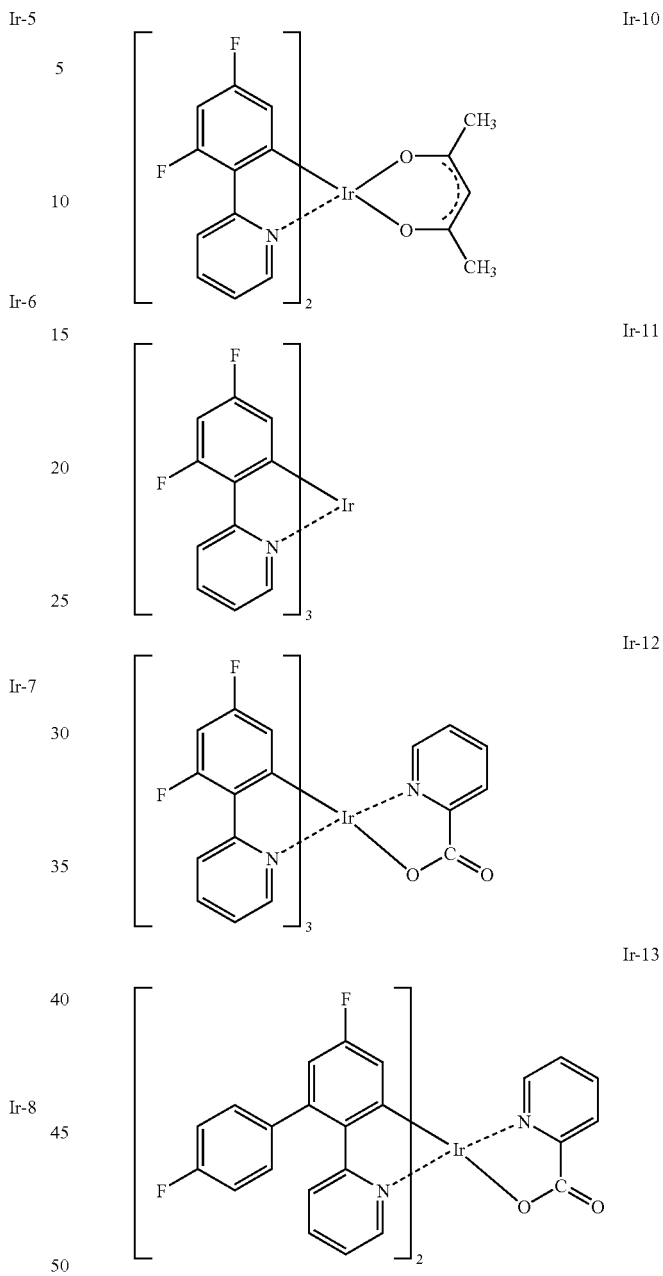

In addition to the above compounds, listed are the following compounds: iridium compounds represented by the formulas or listed as examples in J. Am. Chem. Soc., Vol. 123, pp 4304-4312 (2001), WO00/70655, WO02/15645, JP-A No. 2001-247859, JP-A No. 2001-345183, JP-A No. 2002-117978, JP-A No. 2002-170684, JP-A No. 2002-203678, JP-A No. 2002-235076, JP-A No. 2002-302671, JP-A No. 2002-324679, JP-A No. 2002-332291, JP-A No. 2002-332292 and JP-A No. 2002-338588; and the iridium complex represented by General Formula (IV) in JP-A No. 2002-8860.

The phosphorescence quantum yield in a solution of the phosphorescent compound of the present invention is 0.001 or more at 25° C., but it is preferably 0.01 or more and furthermore preferably 0.1 or more.

The phosphorescent quantum yield can be measured according to a method described in the fourth edition "Jikken Kagaku Koza 7", Bunko II, page 398 (1992) published by Maruzen.

The organic EL element of the present invention contains a compound having an electron withdrawing group and exhibiting a HOMO level of −5.7 to −7.0 eV and a LUMO level of −1.3 to −2.3 eV in an adjacent layer to the emission layer, the adjacent layer being provided between the emission layer and the cathode. This adjacent layer ordinary corresponds to an electron transport layer or a hole blocking layer of an organic EL element, which will be described below.

A hole blocking layer or an electron transport layer provided adjacent to the emission layer has a role to prevent the electron holes migrated from the emission layer from leaching to the cathode, while transporting electrons. Specifically, by incorporating a compound exhibiting a HOMO level of −5.7 to −7.0 eV and a LUMO level of −1.3 to −2.3 eV in the layer adjacent to the emission layer containing a phosphorescent compound, the electron holes migrated from the emission layer containing a phosphorescent compound can be more effectively prevented from leaching to the cathode, whereby an organic EL element exhibiting high luminance, high emission efficiency and long life is obtained.

The constituting layers of the organic EL element of the present invention will be explained below in details.

Preferred examples of the constituting layers of the organic EL element of the present invention will be shown below, however, the present invention is not limited thereto.

(i): Anode/Light emitting layer/Electron transport layer/Cathode (ii): Anode/Hole transport layer/Light emitting layer/Electron transport layer/Cathode (iii): Anode/Hole transport layer/Light emitting layer/Hole blocking layer/Electron transport layer/Cathode (iv): Anode/Hole transport layer/Light emitting layer/Hole blocking layer/Electron transport layer/Cathode buffering layer/Cathode (v): Anode/Anode buffering layer/Hole transport layer/Light emitting layer/Hole blocking layer/Electron transport layer/Cathode buffering layer/Cathode <Anode>

For the anode of the organic EL element, a metal, an alloy, or an electroconductive compound each having a high working function (not less than 4 eV), and mixture thereof are preferably used as the electrode material. Specific examples of such an electrode material include a metal such as Au, CuI and a transparent electroconductive material such as indium tin oxide (ITO), $SnO_2$, or ZnO. A material capable of forming an amorphous and transparent conductive layer such as IDIXO ($In_2O_3$—ZnO) may also be used. The anode may be prepared by forming a thin layer of the electrode material according to a depositing or spattering method, and by forming the layer into a desired pattern according to a photolithographic method. When required precision of the pattern is not so high (not less than 100 µm), the pattern may be formed by depositing or spattering of the electrode material through a mask having a desired form. When light is emitted through the anode, the transmittance of the anode is preferably 10% or more, and the sheet resistance of the anode is preferably not more than several hundred ohm/sq. The thickness of the layer is ordinarily within the range of from 10 nm to 1 µm, and preferably from 10 to 200 nm, although it may vary due to kinds of materials used.

<Cathode>

On the other hand, for the cathode, a metal (also referred to as an electron injecting metal), an alloy, and an electroconductive compound each having a low working function (not more than 4 eV), and a mixture thereof are used as the electrode material. Specific examples of such an electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide ($Al_2O_3$) mixture, indium, a lithium/aluminum mixture, and a rare-earth metal. Among them, a mixture of an electron injecting metal and a metal higher in the working function than that of the electron injecting metal, such as the magnesium/silver mixture, magnesium/aluminum mixture, magnesium/indium mixture, aluminum/aluminum oxide ($Al_2O_3$) mixture, lithium/aluminum mixture, or aluminum is suitable from the view point of the electron injecting ability and resistance to oxidation. The cathode can be prepared forming a thin layer of such an electrode material by a method such as a deposition or spattering method. The sheet resistance as the cathode is preferably not more than several hundred ohm/sq, and the thickness of the layer is ordinarily from 10 nm to 1 µm, and preferably from 50 to 200 nm. It is preferable in increasing the light emission efficiency that either the anode or the cathode of the organic EL element is transparent or semi-transparent.

After a layer of the metal described above as a cathode is formed to give a thickness of from 1 to 20 nm, a layer of the transparent electroconductive material as described in the anode is formed on the resulting metal layer, whereby a transparent or semi-transparent cathode can be prepared. Employing the cathode, an element can be manufactured in which both anode and cathode are transparent.

Next, an injection layer, a blocking layer, and an electron transport layer used in the component layer of the organic EL element of the present invention will be explained.

<Buffer Layer>: Cathode-Buffer Layer, Anode Buffer Layer

The injection layer is optionally provided, for example, a cathode buffer layer (an electron injection layer) or an anode buffer layer (a hole injection layer), and may be provided between the anode and the light emitting layer or hole transport layer, and between the cathode and the light emitting layer or electron transport layer as described above.

The buffer layer herein referred to is a layer provided between the electrode and an organic layer in order to reduce the driving voltage or to improve of light emission efficiency. As the buffer layer there are an anode buffer layer and a cathode buffer layer, which are described in "Electrode Material" pages 123-166, Div. 2 Chapter 2 of "Organic EL element and its frontier of industrialization" (published by NTS Corporation, Nov. 30, 1998) in detail.

The anode buffer layer (hole injection layer) is described in, for example, JP-A Nos. 9-45479, 9-260062, and 8-288069, and its examples include a phthalocyanine buffer layer represented by a copper phthalocyanine layer, an oxide buffer layer represented by a vanadium oxide layer, an amorphous carbon buffer layer, a polymer buffer layer employing and an electroconductive polymer such as polyaniline (emeraldine) and polythiophene.

The cathode buffer layer (an electron injection layer) is described in, for example, JP-A Nos. 6-325871, 9-17574, and 10-74586, in detail, and its examples include a metal buffer layer represented by a strontium or aluminum layer, an alkali metal compound buffer layer represented by a lithium fluoride layer, an alkali earth metal compound buffer layer represented by a magnesium fluoride layer, and an oxide buffer layer represented by an aluminum oxide. The buffer layer (injection layer) is preferably very thin and has a thickness of preferably from 0.1 to 5 μm depending on kinds of the material used.

<Blocking Layer>: Hole Blocking Layer, Electron Blocking Layer

The hole blocking layer is provided adjacent to the emission layer and it is an electron transport layer in a broad sense. The hole transport layer contains a material having an ability of transporting electrons, however, an extremely poor ability of transporting holes, which can increase a recombination probability of electrons and holes by transporting electrons while blocking holes.

When the organic EL element of the present invention contains a hole blocking layer, the layer adjacent to the emission layer corresponds to the hole blocking layer. By incorporating above mentioned compound exhibiting a HOMO level of −5.7 to −7.0 eV and a LUMO level of −1.3 to −2.3 eV as a hole blocking material in the hole blocking layer, an organic EL element exhibiting high luminance, high emission efficiency and long life is obtained.

On the other hand, the electron blocking layer is an hole transport layer in a broad sense, and the electron blocking layer contains a material having an ability of transporting holes, but an extremely poor ability of transporting electrons, which can increase a recombination probability of electrons and holes by transporting holes while blocking electrons.

<Light Emitting Layer>

The light emitting layer of the present invention contains a phosphorescent compound and it is a layer where electrons and holes, injected from electrodes, or from an electron transport layer and a hole transport layer, are recombined to emit light. The portions where light emits may be in the light emitting layer or at the interface between the light emitting layer and the layer adjacent thereto.

By using a phosphorescent compound in the light emitting layer, an organic EL element exhibiting a high emission efficiency.

The light emission of the phosphorescent compound is divided in two types in principle: one is an energy transfer type in which recombination of carriers occurs on the host compound to which the carrier is transported to excite the host compound, the resulting energy is transferred to the phosphorescent compound and light is emitted from the phosphorescent compound; and the other is a carrier trap type in which recombination of carriers occurs on the phosphorescent compound which works as a carrier trap material, and light is emitted from the phosphorescent compound. However, in each type, energy level of the phosphorescent compound in excited state is lower than that of the host compound in excited state.

In the present invention, the phosphorescence maximum wavelength of the phosphorescent compound is not specifically limited. Theoretically, the wavelength of the phosphorescence can be varied by selecting a center metal, a ligand, or a substituent of the ligand. The phosphorescent compound is preferably a phosphorescent compound having a phosphorescence maximum wavelength in the region of from 380 to 430 nm. As such organic electroluminescent elements, those emitting a blue or white light are listed, which exhibit high luminance, high emission efficiency and long life.

Use of a plurality of phosphorescent compounds enables to mix emissions of different colors and emission of an arbitrary color becomes possible. By adjusting types and amounts of phosphorescent compounds, emission of white light is possible, which enables to apply the organic EL element to an illuminator and to a back light of a display.

The light emitting layer may also contain a host compound. In the present invention, a host compound is defined as a compound of which phosphorescent quantum yield is less than 0.01.

In the present invention, as a host compound, above mentioned organic EL element materials are preferably employer, whereby higher emission efficiency is obtained.

A plurality of host compounds known in the art may be used in combination. By using a plurality of host compound, charge transfer is more easily controlled, whereby higher emission efficiency of an organic EL element is obtained. Among those host compounds known in the art, preferable are those having hole transporting ability, electron transport ability and a higher Tg (a glass transition temperature) value, while preventing elongation of the emission wavelength.

Examples of known host compound include the compounds disclosed in the following documents:

JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

In the present invention, carbazole derivatives represented by the following Formula (CA1) are preferably employed as a host compound:

$$X_1\text{-}(A_1)_n \qquad \text{Formula (CA1)}$$

wherein -$A_1$ is represented by the following Formula (CA2) and a plurality of -$A_1$ groups may be the same or different.

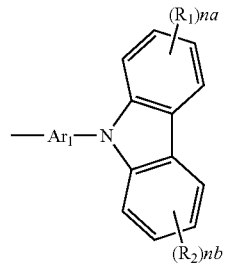

Formula (CA2)

In the above Formula (CA1), $X_1$ represents a direct bond or a divalent linking group. Examples of a divalent linking group include: an alkylene group which may have a substituent, an arylene group which may have a substituent, an oxygen atom, a sulfur atom and a combination thereof. n represents an integer of 2 to 4.

In the above Formula (CA2), $Ar_1$ represents a divalent aromatic group which may have a substitueny or a heteroaromatic group which may have a substituent. Of these, preferable are the following divalent groups which may have a substituent, namely: a phenylene group, a biphenylene group, . . . a naphthylene group, an anthrylene group, a phenanthrylene group, a pyrenylene group, a pyridylene group, a triazylene group, a pyrazylene group, a quinoxalene group and a thienylene group.

The above substituents are common to those mentioned for Formulas (1) to (12).

In Formula (CA2), $R_1$ and $R_2$ each independently represent a substituent, and na and nb each represent an integer of 0 to 4.

When $R_1$ and $R_2$ each independently represent a substituent, the substituents are common to those mentioned for Formulas (1) to (12).

In the present invention, examples of a preferable compound as a host compound include: a carboline derivative and a carboline derivative of which a carbon atom in the hydrocarbon ring constituting the carboline ring is replaced by a nitrogen atom.

Examples of other compounds preferable for a host compound are listed below:

CBP

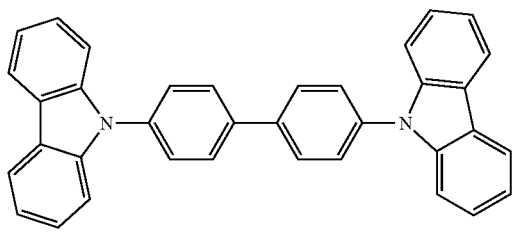

TCBP

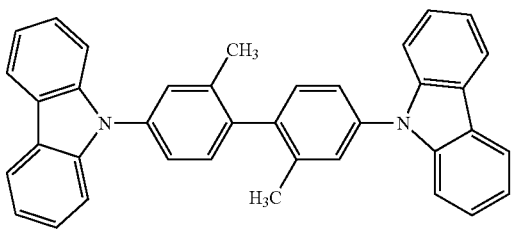

ACTBP

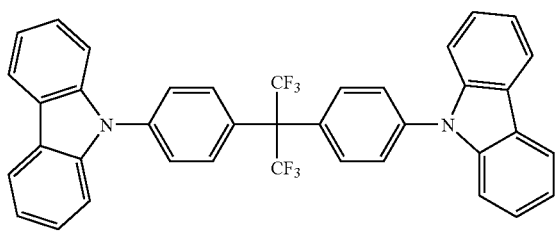

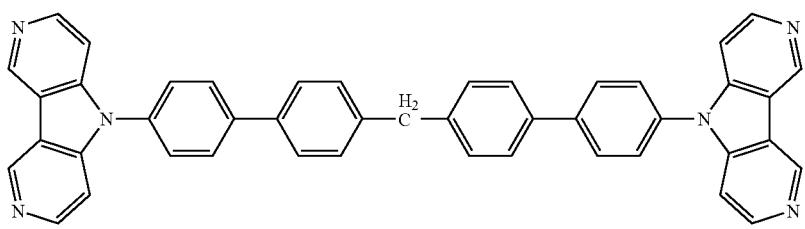

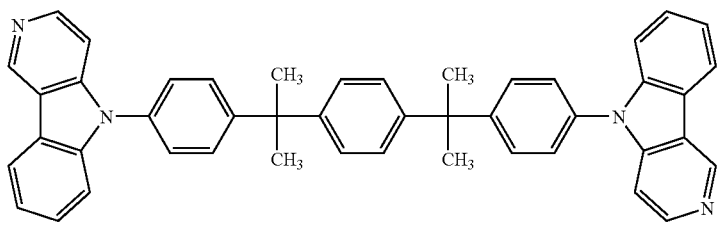

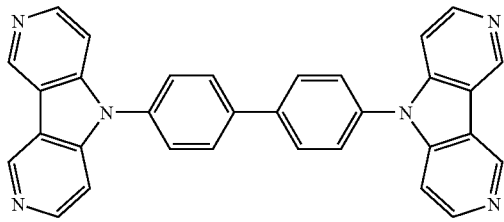

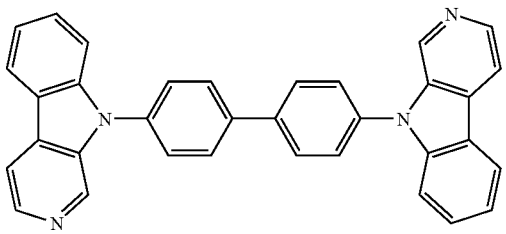

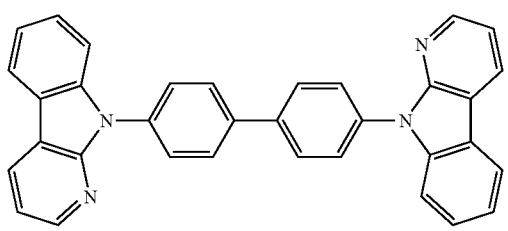

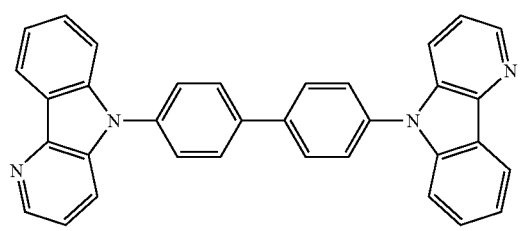

-continued
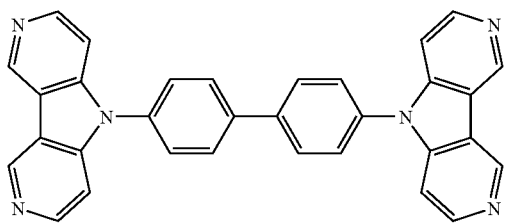
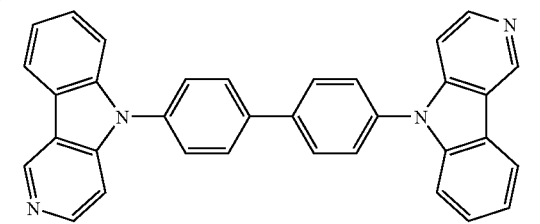
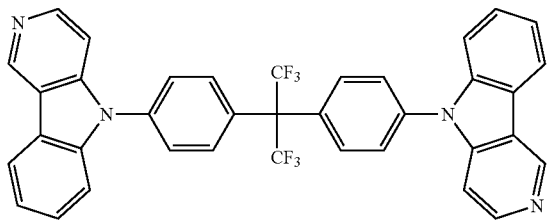
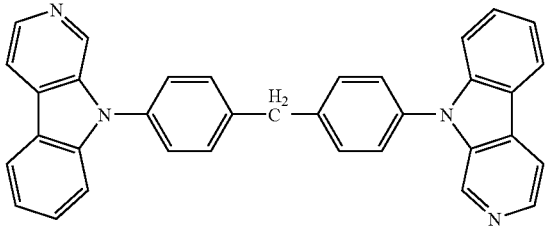
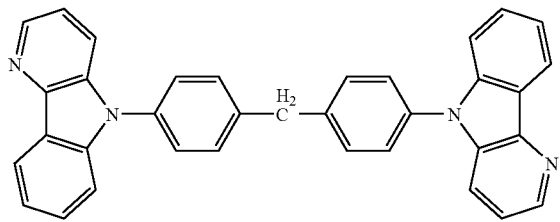
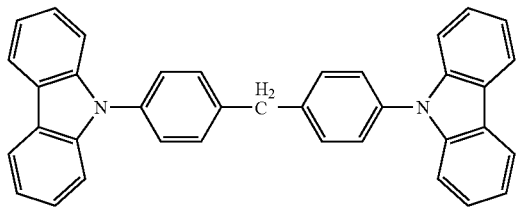
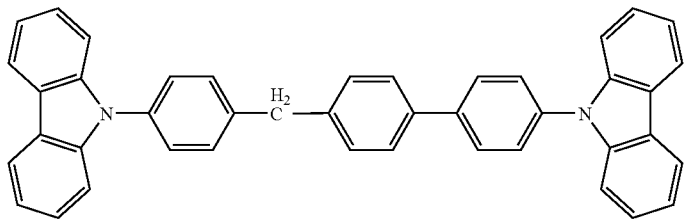
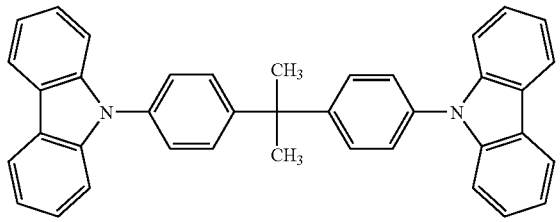
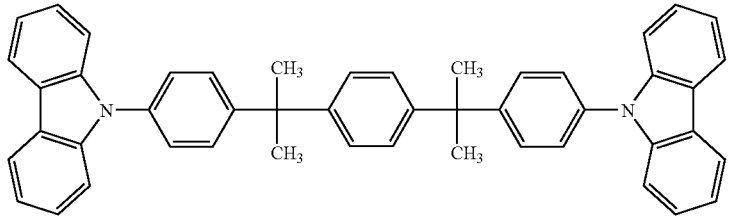

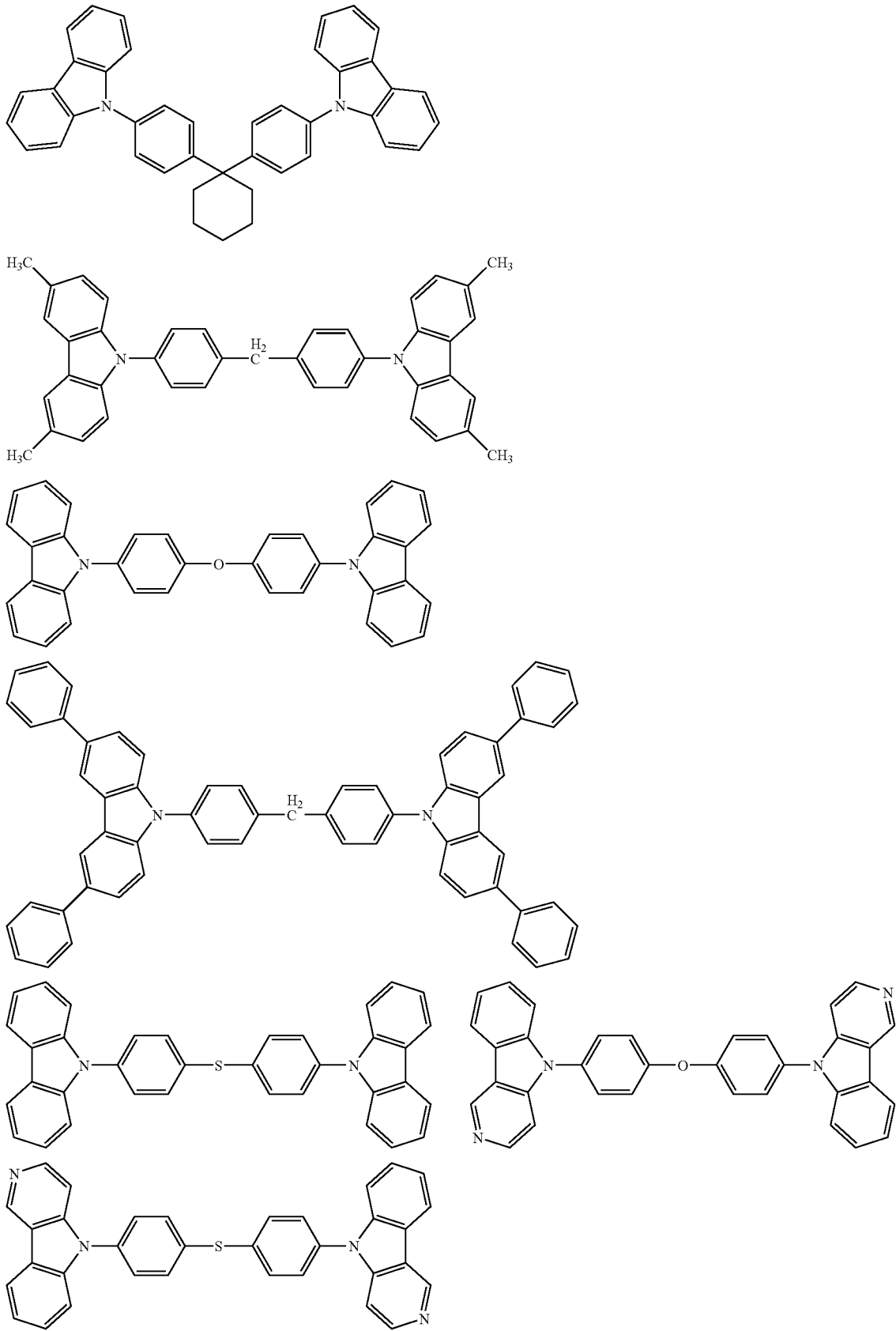

-continued

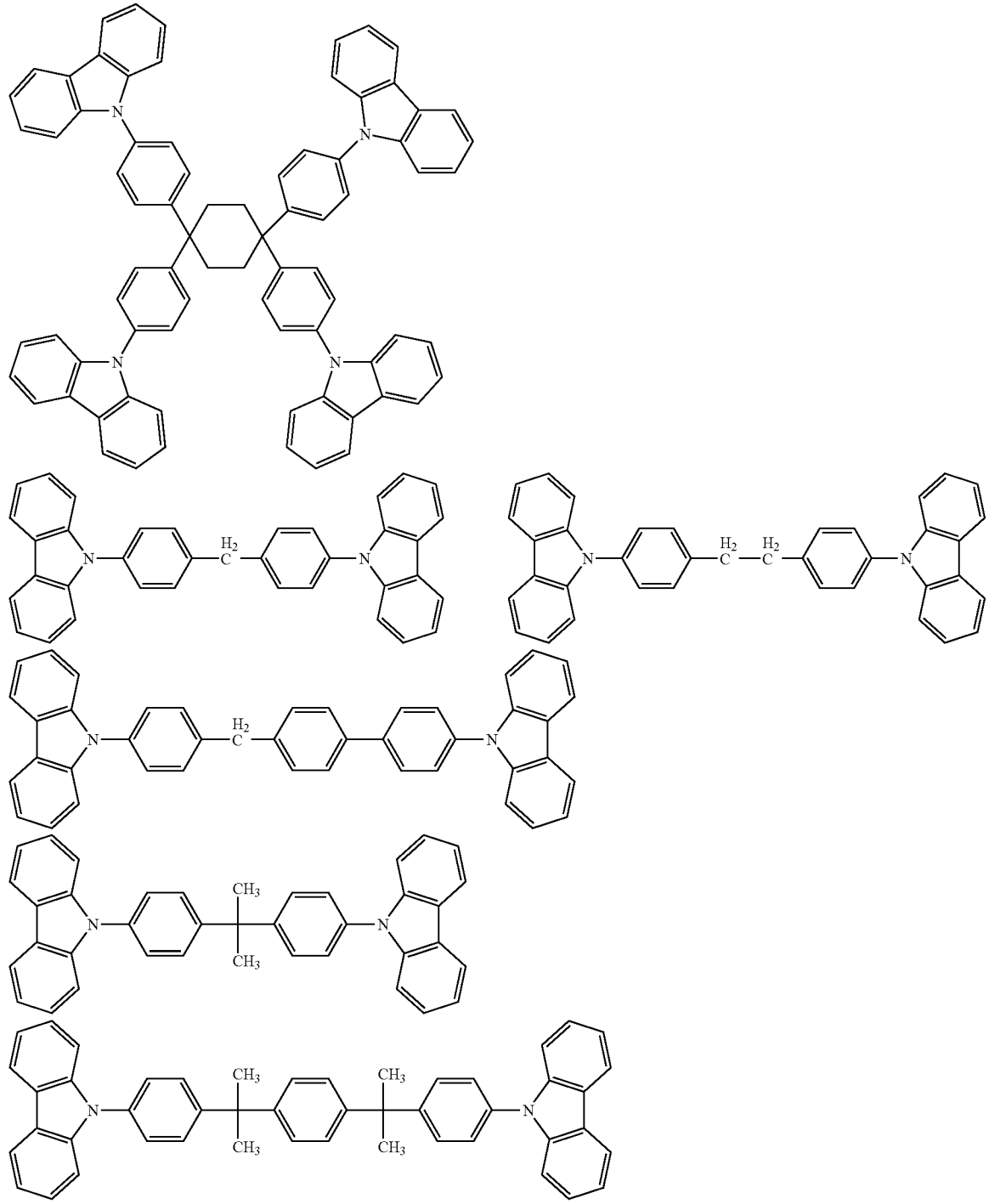

The light emitting layer may further contain a fluorescent compound having a fluorescence maximum wavelength. In this case, by a energy transfer from other host compound or a phosphorescent compound to a fluorescent compound, light emission from a host compound having a fluorescence maximum wavelength is obtained as the result of electroluminescence of an organic EL element. The host compound having a fluorescence maximum wavelength preferably has a high fluorescence quantum yield in the form of solution. Herein, the fluorescence quantum yield is preferably not less than 10%, and more preferably not less than 30%. Examples of the a host compound having a wavelength providing a fluorescence maximum wavelength include a coumarin dye, a cyanine dye, a chloconium dye, a squalenium dye, an oxobenzanthracene dye, a fluorescene dye, a rhodamine dye, a pyrylium dye, a perylene dye, a stilbene dye, and a polythiophene dye. The fluorescence quantum yield can be measured according to a method described in the fourth edition, Jikken Kagaku Koza 7, Bunko II, p. 362 (1992) published by Maruzen.

Figure 4:
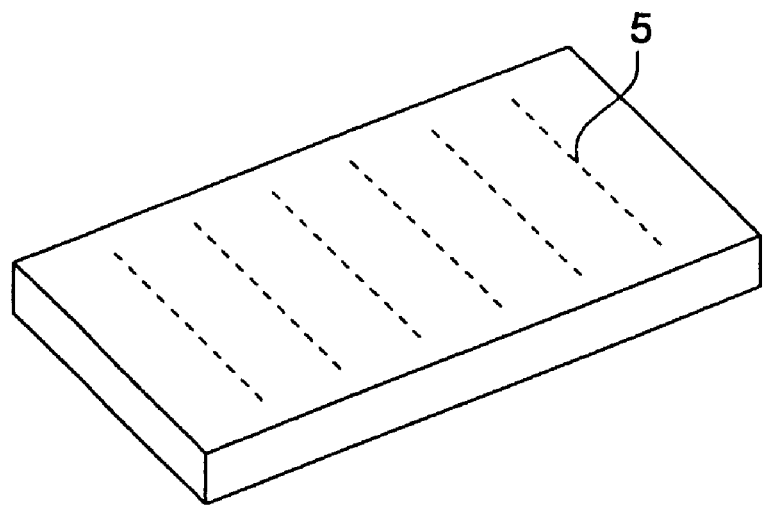
FIG. 4 is a schematic drawing of a display employing a passive matrix method.
Figure 4:
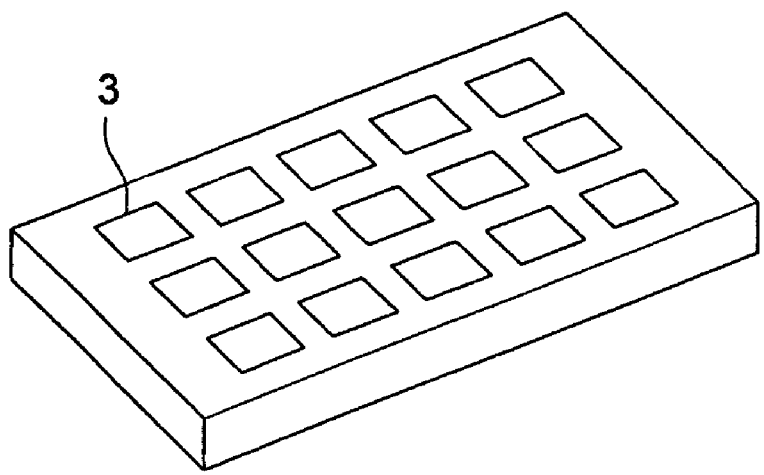
Figure 4:
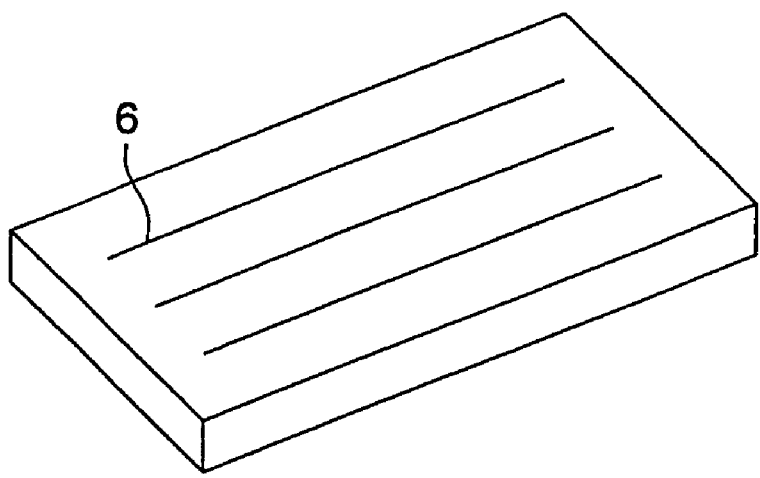

Color of light emitted from the organic EL element or the compound of the present invention is measured by a spectroradiometer CS-1000, manufactured by Minolta Co., Ltd., and expressed according to CIE chromaticity diagram described in FIG. 4.16 on page 108 of "Shinpen Shikisai Kagaku Handbook" (Coloring Science Handbook, New Edition), edited by Nihon Shikisai Gakkai, published by Todai Shuppan Kai, 1985.

The light emitting layer can be formed employing the above-described compounds applied with a known method such as a vacuum deposition method, a spin coat method, a casting method, an LB method or an ink jet method. The thickness of the light emitting layer is not specifically limited, however, it is ordinarily from 5 nm to 5 μm, and preferably from 5 to 200 nm. The light emitting layer may be composed of a single layer containing one or more of phosphorescent compounds or host compounds, or may be composed of plural layers containing the same composition or different compositions.

<Hole Transport Layer>

The hole transport layer contains a hole transporting material having a hole transport ability. A hole injection layer and an electron blocking layer are included in a hole transport layer in a broad sense. The hole transport layer may either be an single layer or a lamination layer containing a plurality of layers.

A hole transport material means a compound having a hole injection ability, a hole transport ability or an electron blocking ability, and it may be an organic substance or an inorganic substance. Examples of a hole transport material include: a triazole derivative, an oxadiazole derivative, an imidazole derivative, a polyarylalkane derivative, a pyrazoline derivative, a pyrazolone derivative, a phenylenediamine derivative, an arylamine derivative, an amino substituted chalcone derivative, an oxazole derivative, a styrylanthracene derivative, a fluorenone derivative, a hydrazone derivative, a stilbene derivative, a silazane derivative, an aniline copolymer, and an electroconductive oligomer, specifically, a thiophene oligomer. As the hole transporting material, those described above are used, however, a porphyrin compound, an aromatic tertiary amine compound and a styrylamine compound are preferable, and, specifically, an aromatic tertiary amine compound is more preferable.

Typical examples of the aromatic tertiary amine compound and styrylamine compound include: N,N,N',N'-tetraphenyl-4,4'-diaminophenyl, N,N'-diphenyl-N,N'-bis(3-methylphenyl)-[1,1'-biphenyl]-4,4'-diamine (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl) phenylmethane, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostylbene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in JP-A No. 4-308688 such as 4,4',4"-tris[N-(3-methylphenyl)-N-phenylamino]-triphenylamine (MTDATA) in which three triphenylamine units are bonded in a starburst form.

A polymer in which the material mentioned above is introduced in the polymer chain or a polymer having the above mentioned material as the polymer main chain can also be used. As a hole injecting material or a hole transport material, inorganic compounds such as p-Si and p-SiC are usable.

The hole transport layer can be formed by preparing a thin layer of the hole transporting material using a known method such as a vacuum deposition method, a spin coat method, a casting method, an ink jet method, and an LB method. The thickness of the hole transport layer is not specifically limited, however, it is ordinarily from 5 nm to 5 μm. The hole transport layer may be composed of a single layer structure containing one or more of the materials mentioned above.

<Electron Transport Layer>

The electron transport layer contains a material having an electron transport ability, and in a broad sense an electron injection layer or a hole blocking layer are included in an electron transport layer. The electron transport layer can be provided as a single layer or as a plurality of layers.

When an organic EL element does not include a hole blocking layer, and an electron transport layer is provided adjacent to a light emission layer (where the electron transport layer also works as a hole blocking layer), as in the above examples of constituting layers (i) and (ii), the above described compound having an electron withdrawing group and exhibiting a HOMO level of −5.7 to −7.0 eV and a LUMO level of −1.3 to −2.3 eV is preferably used as the electron transport material contained in the electron transport layer, whereby an organic EL element exhibiting high luminance, high emission efficiency and long life is obtained.

When the organic EL element includes a hole blocking layer provided adjacent to the light emission layer, as in the above examples of constituting layers (iii), (iv) and (v), conventional electron transport materials are usable as the electron transport material contained in the electron transport layer. In this case, the electron transport material is usable when it merely has a function to transport electrons injected at the cathode to the light emission layer. Such electron transport materials may be optionally selected from known compounds used as electron transport materials, and examples of which include a nitro-substituted fluorene derivative, a diphenylquinone derivative, a thiopyran dioxide derivative, a carbodiimide, a fluolenylidenemethane derivative, an anthraquinodimethane, an anthrone derivative, and an oxadiazole derivative. Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are usable as the electron transport material.

Also, the above mentioned compound having an electron withdrawing group and exhibiting a HOMO level of −5.7 to −7.0 eV and a LUMO level of −1.3 to −2.3 eV is usable.

A polymer in which the materials mentioned above are introduced in the polymer side chain or a polymer having those materials as the polymer main chain are also applicable.

A metal complex of an 8-quinolynol derivative such as aluminum tris(8-quinolynol) (Alq), aluminum tris(5,7-dichloro-8-quinolynol), aluminum tris(5,7-dibromo-8-quinolynol), aluminum tris(2-methyl-8-quinolynol), aluminum tris(5-methyl-8-quinolynol), or zinc bis(8-quinolynol) (Znq), and a metal complex formed by replacing the central metal of the foregoing complexes with another metal atom such as In, Mg, Cu, Ca, Sn, Ga or Pb, can be used as the electron transporting material. Furthermore, a metal free or metal-containing phthalocyanine, and a derivative thereof, in which the molecular terminal is replaced by a substituent such as an alkyl group or a sulfonic acid group, are also preferably used as the electron transporting material. The distyrylpyrazine derivative exemplified as a material for the light emitting layer may preferably be employed as the electron transporting material. An inorganic semiconductor such as n-Si and n-SiC may also be used as the electron transporting material in a similar way as in the hole transport layer.

The electron transport layer can be formed employing the above described electron transporting materials and a known method such as a vacuum deposition method, a spin coat method, a casting method, a printing method including an ink jet method or an LB method. The thickness of electron transport layer is not specifically limited, however, is ordinarily from 5 nm to 5 μm, and preferably from 5 to 200 nm. The electron transport layer may be composed of a single layer containing one or two or more of the electron transporting material.

<Substrate (Also Referred to as Base Plate, Base or Support)>

The organic EL element of the present invention is preferably provided on a substrate.

The substrate employed for the organic electroluminescent element of the present invention is not restricted to specific kinds of materials such as glass and plastic, as far as it is transparent. Examples of the substrate preferably used include glass, quartz and light transmissible plastic film. Specifically preferred one is a resin film capable of providing flexibility to the organic EL element.

Examples of the resin film include films of polyethylene terephthalate (PET), polyethylene naphthalate (PEN), polyethersulfone (PES), polyetherimide, polyetheretherketone, polyphenylene sulfide, polyarylate, polyimide, polycarbonate (PC), cellulose triacetate (TAC), cellulose acetate propionate (CAP). The surface of the resin film may have a layer of an inorganic or organic compound or a hybrid layer of both compounds.

The external light emission efficiency of the organic electroluminescent element of the present invention is preferably not less than 1%, and more preferably not less than 5% at room temperature. Herein, external quantum yield (%) is represented by the following formula:

External quantum yield (%)=((the number of photons emitted to the exterior of the organic electroluminescent element)/(the number of electrons supplied to the organic electroluminescent element))×100

A hue improving filter such as a color filter may be used in combination or a color conversion filter which can convert emission light color from an organic EL element to multicolor employing a fluorescent compound may be used in combination. In the case where the color conversion filter is used, the λmax of the light emitted from the organic EL element is preferably not more than 480 nm.

<Preparation of Organic EL Element>

For one example, the preparation of the organic EL element, which has the following constitution will be described: Anode/Hole injection layer/Hole transport layer/Light emitting layer/Electron transport layer/Electron injection layer/Cathode.

A thin layer of a desired material for an electrode such as a material of the anode is formed on a suitable substrate by a deposition or sputtering method to prepare the anode so that the thickness of the layer is not more than 1 μm and preferably within the range of from 10 to 200 nm. Then organic compound thin layers including the anode buffer layer, the hole transport layer, the light emitting layer, the hole blocking layer and the cathode buffer layer, which constitute the organic EL element, are formed on the resulting anode in that order as.

As methods for formation of the thin layers, as the same as described above, there are a vacuum deposition method and a wet process (for example, a spin coating method, a casting method, an ink jet method, and a printing method), however, a vacuum deposition method, a spin coating method, an ink jet method and a printing method are preferably used, since a uniform layer without a pinhole can be formed. Different methods may be used for formation of different layers. When the vacuum deposition method is used for the thin layer formation method, although conditions of the vacuum deposition differs due to kinds of materials used, vacuum deposition is preferably carried out at a boat temperature of from 50° C. to 450° C., at a degree of vacuum of from 10 to 10 Pa, at a deposition speed of from 0.01 to 50 nm/second, and at a substrate temperature of from −50 to 300° C. to form a layer with a thickness of from 0.1 nm to 5 μm, preferably from 5 to 200 nm.

After these layers has been formed, a thin layer of a material for a cathode is formed thereon to prepare a cathode, employing, for example, a deposition method or sputtering method to give a thickness of not more than 1 μm, and preferably from 50 to 200 nm. Thus, a desired organic EL element is obtained. It is preferred that the layers from the hole injection layer to the cathode are continuously formed under one time of vacuuming to obtain an organic EL element. However, on the way of the layer formation under vacuum, a different layer formation method by taking the layer out of the vacuum chamber may be inserted. When the different method is used, the process is required to be carried out under a dry inert gas atmosphere.

In the multicolor display of the present invention, the light emitting layer only is formed using a shadow mask, and the other layers, besides the light emitting layer, are formed employing a vacuum method, a casting method, a spin coat method or a printing method in which patterning employing the shadow mask is not required.

When the light emitting layer only is formed by patterning, the layer formation, although not specifically limited, is carried out preferably according to a deposition method, an ink jet method or a printing method. When a deposition method is used as the layer formation method, patterning of the layer is preferably carried out employing a shadow mask.

Further, the organic EL element can be prepared in the reverse order, in which the cathode, the cathode buffer layer, the electron transport layer, the hole transport layer, the light emitting layer, the hole transport layer, the anode buffer layer, and the anode are formed in that order. When a direct current voltage, a voltage of 2 to 40 V is applied to thus obtained multicolor display, setting the anode as a + polarity and the cathode as a − polarity, light emission occurs. An alternating current may also be applied to cause light emission. Arbitrary wave shape of alternating current may be used.

The display of the present invention can be used as a display device, a display, or various light emission sources. The display device or the display, which employs three kinds of organic EL elements emitting a blue light, a red light and a green light can present a full color image.

Examples of the display device or the display include a television, a personal computer, a mobile device or an AV device, a display for text broadcasting, and an information display used in a car. The display device may be used as specifically a display for reproducing a still image or a moving image. When the display device is used as a display for reproducing a moving image, the driving method may be either a simple matrix (passive matrix) method or an active matrix method.

Examples of an illuminator include a home lamp, a room lamp in a car, a backlight for a watch or a liquid crystal, a light source for boarding advertisement, a signal device, a light source for a photo memory medium, a light source for an electrophotographic copier, a light source for an optical communication instrument, and a light source for an optical sensor, however, are not limited thereto.

The organic EL element of the present invention may be an organic EL element having a resonator structure.

The organic EL element having a resonator structure is applied to a light source for a photo-memory medium, a light source for an electrophotographic copier, a light source for an optical communication instrument, or a light source for a photo-sensor, however, its application is not limited thereto. In the above application, a laser oscillation may be carried out.

<Display>

The organic EL element of the present invention can be used as a lamp such as an illuminating lamp or a light source for exposure, as a projection device for projecting an image, or as a display for directly viewing a still image or a moving image. When the element is used in a display for reproducing a moving image, the driving method may be either a simple matrix (passive matrix) method or an active matrix method. The display can present a full color image by employing two or more kinds of organic EL elements each emitting light with a different color. A monochromatic color, for example, a white color can be converted to a full color of BGR, employing a color filter. Further, employing a color conversion filter, light color emitted from the organic EL element can be converted to another color or full color, where the λmax of the light emitted from the organic EL element is preferably not more th an 480 nm.

One of the examples of the display containing the organic EL element of the present invention will be explained below employing Figures.

FIG. 1 is a schematic drawing of one example of a display containing an organic EL element. FIG. 1 is a display such as that of a cellular phone, displaying image information due to light emission from the organic EL.

Display 1 contains a display section A having plural pixels and a control section B carrying out image scanning based on image information to display an image in the display section A.

The control section B is electrically connected to the display section A, transmits a scanning signal and an image data signal to each of the plural pixels based on image information from the exterior, and conducts image scanning which emits light from each pixel due to the scanning signal according to the image data signal, whereby an image is displayed on the display section A.

Figure 2:
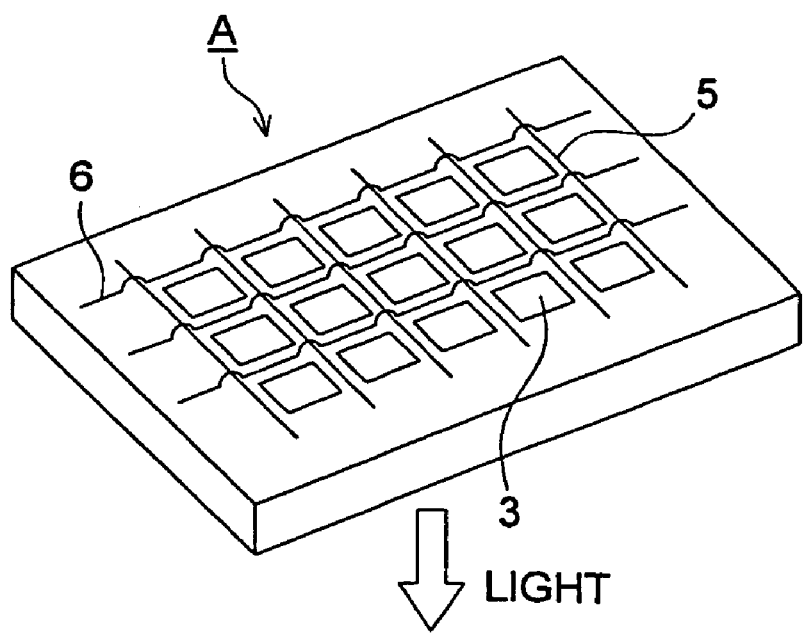
FIG. 2 is a schematic drawing of a display section.

FIG. 2 is a schematic drawing of a display section A. The display section A contains a substrate, plural pixels 3, and a wiring section containing plural scanning lines 5 and plural data lines 6'. The main members of the display section A will be explained below. In FIG. 2, light from pixels 3 is emitted in the direction of an arrow.

The plural scanning lines 5 and plural data lines 6 of the wiring section 2 each are composed of an electroconductive material, the lines 5 and the lines 6 being crossed with each other at a right angle, and connected with the pixels 3 at the crossed points (not illustrated).

The plural pixels 3, when the scanning signal is applied from the scanning lines 5, receive the data signal from the data lines 6, and emit light corresponding to the image data received. Provision of red light emitting pixels, green light emitting pixels, and blue light emitting pixels side by side on the same substrate can display a full color image.

Next, an emission process of pixels will be explained.

Figure 3:
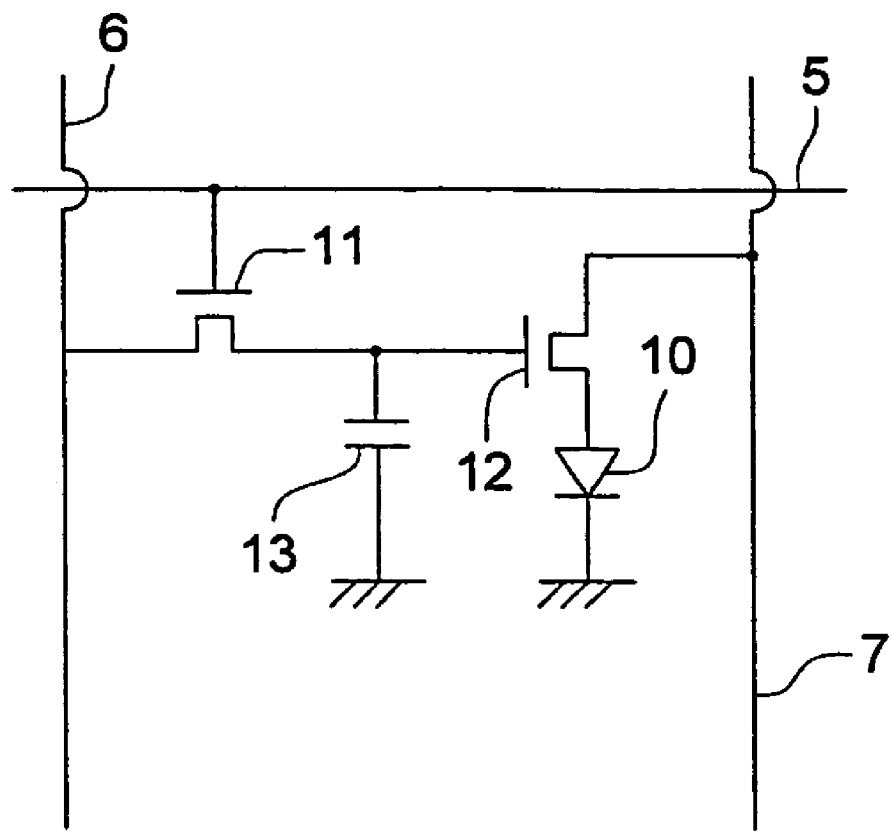
FIG. 3 is a schematic drawing of a pixel.

FIG. 3 is a schematic drawing of a pixel.

The pixel contains an organic EL element 110, a switching transistor 11, a driving transistor 12, and a capacitor 13. When a pixel with a red light emitting organic EL element, a pixel with a green light emitting organic EL element, and a pixel with a blue light emitting organic EL element are provided side by side on the same substrate, a full color image can be displayed.

In FIG. 3, an image data signal is applied through the data lines 6 from the control section B to a drain of the switching transistor 11, and when a scanning signal is applied to a gate of the switching transistor 11 through the scanning lines 5 from the control section B, the switching transistor 11 is switched on, and the image signal data applied to the drain is transmitted to the capacitor 13 and the gate of the driving transistor 12.

The capacitor 13 is charged according to the electric potential of the image data signal transmitted, and the driving transistor 12 is switched on. In the driving transistor 12, the drain is connected to an electric source line 7, and the source to an organic EL element 10. Current is supplied from the electric source line 7 to the organic EL element 10 according to the electric potential of the image data signal applied to the gate.

The scanning signal is transmitted to the next scanning line 5 according to the successive scanning of the control section B, the switching transistor 11 is switched off. Even if the switching transistor 11 is switched off, the driving transistor 12 is turned on since the capacitor 13 maintains a charged potential of image data signal, and light emission from the organic EL element 10 continues until the next scanning signal is applied. When the next scanning signal is applied according the successive scanning, the driving transistor 12 works according to an electric potential of the next image data signal synchronized with the scanning signal, and light is emitted from the organic EL element 10.

That is, light is emitted from the organic EL element 10 in each of the plural pixels 3 due to the switching transistor 11 as an active element and the driving transistor 12 each being provided in the organic EL element 10 of each of the plural pixels 3. This emission process is called an active matrix process.

Herein, light emission from the organic EL element 10 may be emission with plural gradations according to image signal data of multiple value having plural gradation potentials, or emission due to on-off according to a binary value of the image data signals.

The electric potential of the capacitor 13 may maintain till the next application of the scanning signal, or may be discharged immediately before the next scanning signal is applied.

In the present invention, light emission may be carried out employing a passive matrix method as well as the active matrix method as described above. The passive matrix method is one in which light is emitted from the organic EL element according to the data signal only when the scanning signals are scanned.

FIG. 4 is a schematic drawing of a display employing a passive matrix method.

In FIG. 4, pixels 3 are provided between the scanning lines 5 and the data lines 6, crossing with each other.

When scanning signal is applied to scanning line 5 according to successive scanning, pixel 3 connecting the scanning line 5 emits according to the image data signal. The passive matrix method has no active element in the pixel 3, which reduces manufacturing cost of a display.

EXAMPLES

The present invention will now be explained using the examples, however, the present invention is not limited thereto.

Example 1

Preparation of Organic EL Elements 1-1 to 1-16

A pattern was formed on a substrate (100 mm×100 mm×1.1 mm) composed of a glass plate and a 100 nm ITO (indium tin oxide) layer (NA45 manufactured by NH Technoglass Co., Ltd.) as an anode. Then the resulting transparent substrate having the ITO transparent electrode was subjected to ultrasonic washing in i-propyl alcohol and dried with a dry nitrogen gas and subjected to UV-ozone cleaning for 5 minutes. Thus obtained transparent substrate was fixed on a substrate holder of a vacuum deposition apparatus available on the market. Further, 200 mg of m-MTDATXA was placed in a first resistive heating molybdenum boat, 200 mg of ATCBP was put in a second resistive heating molybdenum boat, 200 mg of bathocuproine (BC) was placed in a third resistive heating molybdenum boat, 100 mg of Ir-12 was placed in a fourth resistive heating molybdenum boat, and 0.200 mg of Alq$_3$ was placed in a fifth resistive heating molybdenum boat, and then fixed in the vacuum deposition apparatus.

The pressure in the vacuum tank was reduced to 4×10$^{-4}$ Pa. Then, the boat carrying m-MTDATXA was heated by supplying an electric current to the boat, and m-MTDATXA was deposited onto the transparent substrate at a depositing speed of 0.1 nm/sec to form a 50 nm thick hole transport layer. After that, the boat carrying ATCBP and the boat carrying Ir-12 were heated by supplying an electric current to both boats, and ATCBP at a depositing speed of 0.2 nm/sec and Ir-12 at a depositing speed of 0.012 nm/sec were co-deposited onto the resulting hole transport layer to form a light emitting layer with a thickness of 30 nm.

Subsequently, the boat carrying BC was heated by supplying an electric current to the boat, and BC was deposited onto the resulting light emitting layer at a depositing speed of 0.1 nm/sec to form a hole blocking layer with a thickness of 10 nm.

Further, the boat carrying Alq$_3$ was heated by supplying an electric current to the boat, and Alq$_3$ was deposited onto the resulting-hole blocking layer at a depositing speed of 0.1 nm/sec to form an electron transport layer with a thickness of 40 nm. The temperature of the substrate at the time of the deposition was room temperature.

After that, a 0.5 nm thick lithium fluoride layer as a cathode buffer layer and a 110 nm thick aluminum layer as a cathode were deposited. Thus, Organic EL Element 1-1 was prepared.

Organic EL Elements 1-2 to 1-16 were prepared in the same manner as Organic EL Element 1-1 except that BC was replaced with the organic EL materials shown in Table 1 to form a hole blocking layer. The structures of the compounds used above and in Table 1 are shown below:

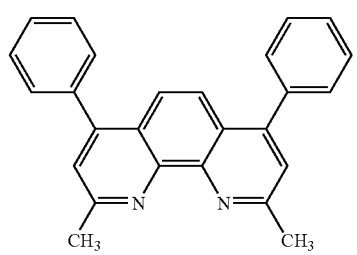

BC

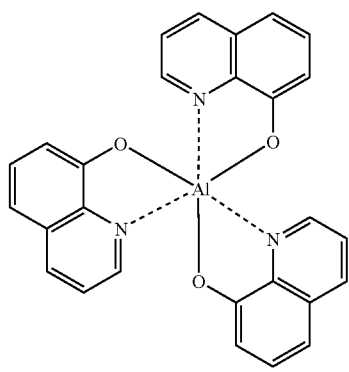

Alq3

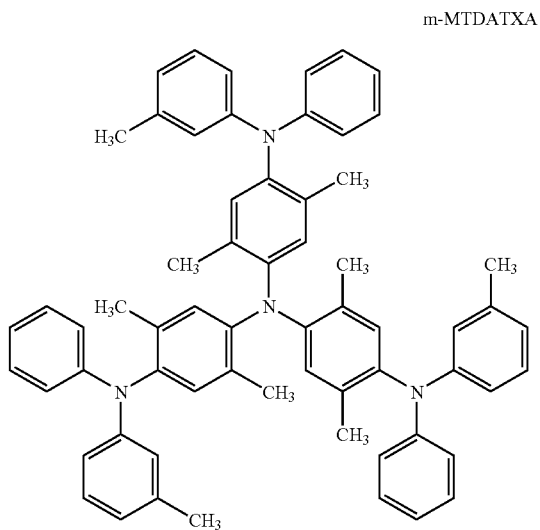

m-MTDATXA

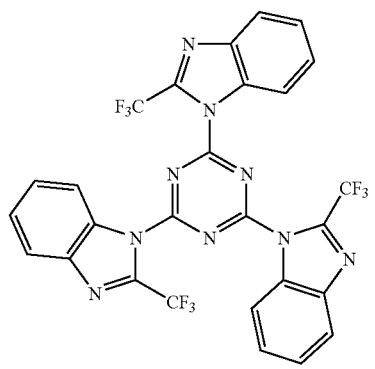

TABI

-continued pf-7y
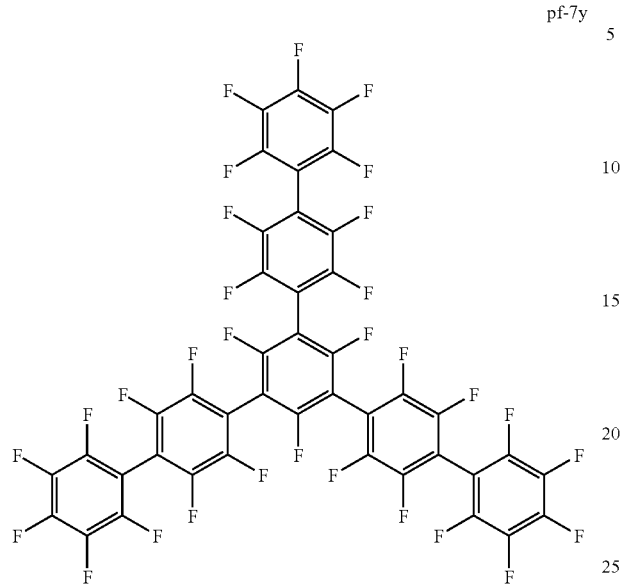

Cz1
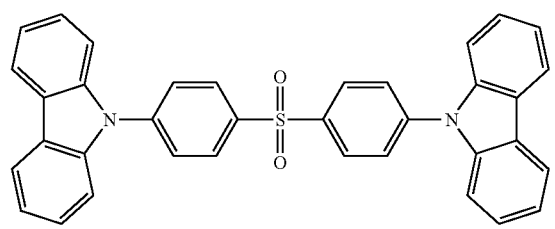

Cz2
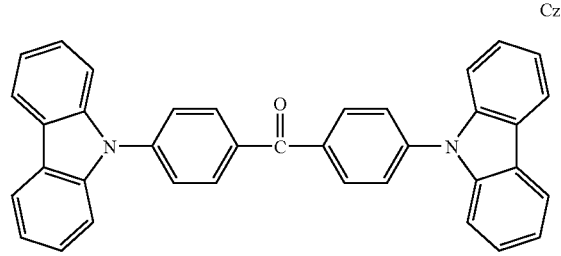

TPBI
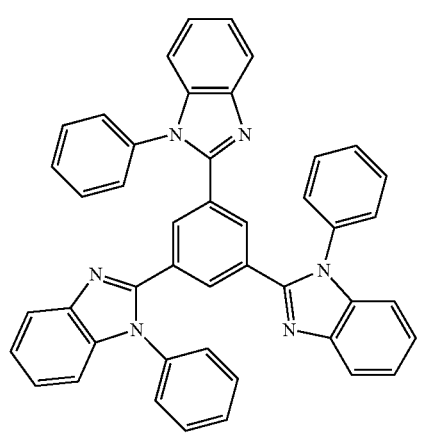

-continued

BAlq
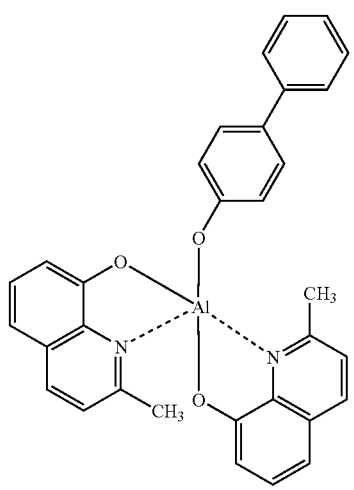

<Evaluation of Organic EL Elements 1-1 to 1-16

The Organic EL Elements 1-1 to 1-16 obtained as above were evaluated as follows, and the results were shown in Table 1.

(Luminance)

Luminance ($cd/m^2$) was measured by using a spectroradiometer CS-1000 produced by Minolta Inc.

(External Quantum Efficiency)

Electric current of 2.5 $mA/cm^2$ was supplied to each organic EL element at 23° C. in a dry nitrogen atmosphere, and the external quantum efficiency (%) of each sample was measured. The external quantum efficiency (%) was calculated from the date obtained by using a spectroradiometer CS-1000 produced by Minolta Inc.

(Emission Life)

A period in which an initial emission intensity of an organic EL element decreased to half of it was defined as a half-life period ($\tau 0.5$) and used as an index of the life of an organic EL element, the emission intensity being measured by supplying a constant electric current of 2.5 $mA/cm^2$ at 23° C. in a dry nitrogen atmosphere. A spectroradiometer CS-1000 produced by Minolta Inc. was used for the measurement.

In Table 1, the luminance, external quantum efficiency and emission life were expressed by relative values when each of the luminance, external quantum efficiency and emission life of Organic EL Element 1-1 was set to 100.

TABLE 1

| Organic EL Element | Hole Blocking Material Compound | HOMO | LUMO | Luminance (Relative Value %) | External Quantum-Efficiency (Relative Value %) | Emission Life (Relative Value %) | Remarks |
|---|---|---|---|---|---|---|---|
| 1-1 | BC | −5.8 | −1.3 | 100 | 100 | 100 | Comp. |
| 1-2 | Pf-7y | −7.1 | −2.2 | 121 | 120 | 113 | Comp. |
| 1-3 | TPBI | −5.7 | −1.2 | 118 | 118 | 150 | Comp. |
| 1-4 | BAlg | −5.1 | −1.4 | 76 | 72 | 667 | Comp. |
| 1-5 | Cz1 | −5.6 | −1.7 | 97 | 97 | 83 | Comp. |
| 1-6 | Cz2 | −5.5 | −2.0 | 95 | 94 | 90 | Comp. |
| 1-7 | TABI | −6.8 | −2.5 | 115 | 116 | 95 | Comp. |
| 1-8 | 30 | −6.1 | −1.8 | 151 | 152 | 874 | Inv. |
| 1-9 | 31 | −6.2 | −1.9 | 148 | 146 | 852 | Inv. |
| 1-10 | 43 | −6.5 | −2.1 | 143 | 145 | 832 | Inv. |
| 1-11 | 45 | −5.8 | −1.3 | 138 | 141 | 755 | Inv. |
| 1-12 | 47 | −6.6 | −1.9 | 148 | 150 | 792 | Inv. |
| 1-13 | 48 | −6.8 | −2.3 | 144 | 145 | 775 | Inv. |
| 1-14 | 49 | −6.0 | −1.6 | 152 | 157 | 810 | Inv. |
| 1-15 | 53 | −5.9 | −1.5 | 139 | 137 | 712 | Inv. |
| 1-16 | 57 | −6.3 | −1.8 | 149 | 150 | 825 | Inv. |

Inv.: Inventive Sample,
Comp.: Comparative Sample

Table 1 revealed that the organic EL elements of the present invention exhibited excellent luminance, external quantum efficiency as well as long life.

Example 2

Preparation of Organic EL Elements 2-1 to 14

A pattern was formed on a substrate (100 mm×100 mm×1.1 mm) composed of a glass plate and a 100 nm ITO (indium tin oxide) layer (NA45 manufactured by NH Technoglass Co., Ltd.) as an anode. Then the resulting transparent substrate having the ITO transparent electrode was subjected to ultrasonic washing in i-propyl alcohol and dried with a dry nitrogen gas and subjected to UV-ozone cleaning for 5 minutes. Thus obtained transparent substrate was fixed on a substrate holder of a vacuum deposition apparatus available on the market. Further, 200 mg of m-MTDATXA was placed in a first resistive heating molybdenum boat, 200 mg of ACZ-1 was put in a second resistive heating molybdenum boat, 200 mg of bathocuproine (BC) was placed in a third resistive heating molybdenum boat, 100 mg of Ir-12 was placed in a fourth resistive heating molybdenum boat, and 200 mg of Alq$_3$ was placed in a fifth resistive heating molybdenum boat, and then fixed in the vacuum deposition apparatus.

The pressure in the vacuum tank was reduced to 4×10$^{-4}$ Pa. Then, the boat carrying m-MTDATXA was heated by supplying an electric current to the boat, and m-MTDATXA was deposited onto the transparent substrate at a depositing speed of 0.1 nm/sec to form a 50 nm thick hole transport layer. After that, the boat carrying ACZ1 and the boat carrying Ir-12 were heated by supplying an electric current to both boats, and ACZ1 at a depositing speed of 0.2 nm/sec and Ir-12 at a depositing speed of 0.012 nm/sec were co-deposited onto the resulting hole transport layer to form a light emitting layer with a thickness of 30 nm.

Subsequently, the boat carrying BC was heated by supplying an electric current to the boat, and BC was deposited onto the resulting light emitting layer at a depositing speed of 0.1 nm/sec to form a hole blocking layer with a thickness of 10 nm.

Further, the boat carrying Alq$_3$ was heated by supplying an electric current to the boat, and Alq$_3$ was deposited onto the resulting hole blocking layer at a depositing speed of 0.1 nm/sec to form an electron transport layer with a thickness of 40 nm. The temperature of the substrate at the time of the deposition was room temperature.

After that, a 0.5 nm thick lithium fluoride layer as a cathode buffer layer and a 110 nm thick aluminum layer as a cathode were deposited. Thus, Organic EL Element 2-1 was prepared.

organic EL Elements 2-2 to 2-14 were prepared in the same manner as organic EL Element 2-1 except that BC was replaced with the organic EL materials shown in Table 2 to from a hole blocking layer. The structures of the compounds used above and in Table 2 are shown below:

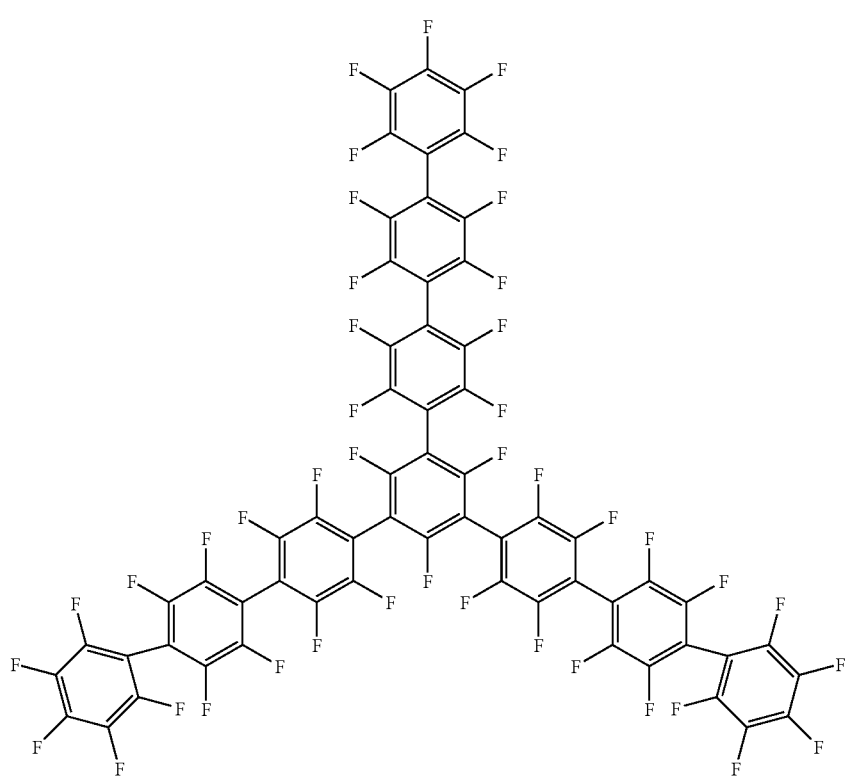

pf-10y

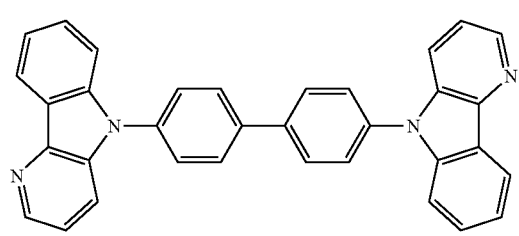

ACZ1

<Evaluation of Organic EL Elements 2-1 to 2-14>

The Organic EL Elements 2-1 to 2-14 obtained as above were evaluated as follows, and the results were shown in Table 2.

(Luminance)

Luminance ($cd/m^2$) was measured by using a spectroradiometer CS-1000 produced by Minolta Inc.

(External Quantum Efficiency)

Electric current of 2.5 $mA/cm^2$ was supplied to each organic EL element at 23° C. in a dry nitrogen atmosphere, and the external quantum efficiency (%) of each sample was measured. The external quantum efficiency (%) was calculated from the date obtained by using a spectroradiometer CS-1000 produced by Minolta Inc.

(Emission Life)

A period in which an initial emission intensity of an organic EL element decreased to half of it was defined as a half-life period ($\tau 0.5$) and used as an index of the life of an organic EL element, the emission intensity being measured by supplying a constant electric current of 2.5 $mA/cm^2$ at 23° C. in a dry nitrogen atmosphere. A spectroradiometer CS-1000 produced by Minolta Inc. was used for the measurement.

In Table 2, the luminance, external quantum efficiency and emission life were expressed by relative values when each of the luminance, external quantum efficiency and emission life of Organic EL Element 2-1 was set to 100.

TABLE 2

| Organic EL Element | Hole Blocking Material Compound | HOMO (eV) | LUMO (eV) | Luminance (Relative Value %) | External Quantum-Efficiency (Relative Value %) | Emission Life (Relative Value %) | Remarks |
|---|---|---|---|---|---|---|---|
| 2-1 | BC | −5.8 | −1.3 | 100 | 100 | 100 | Comp. |
| 2-2 | Pf-7y | −7.1 | −2.2 | 118 | 117 | 113 | Comp. |
| 2-3 | Pf-10y | −7.1 | −2.3 | 120 | 118 | 105 | Comp. |
| 2-4 | TPBI | −5.7 | −1.2 | 115 | 113 | 132 | Comp. |
| 2-5 | BAlq | −5.1 | −1.4 | 81 | 79 | 620 | Comp. |
| 2-6 | Cz1 | −5.6 | −1.7 | 90 | 88 | 90 | Comp. |
| 2-7 | Cz2 | −5.5 | −2.0 | 94 | 95 | 84 | Comp. |
| 2-8 | TABI | −6.8 | −2.5 | 104 | 102 | 90 | Comp. |
| 2-9 | (7) | −5.7 | −1.5 | 139 | 138 | 707 | Inv. |
| 2-10 | (14) | −6.2 | −2.3 | 143 | 142 | 713 | Inv. |
| 2-11 | (51) | −6.6 | −2.3 | 140 | 140 | 732 | Inv. |
| 2-12 | (52) | −6.2 | −1.6 | 147 | 145 | 795 | Inv. |
| 2-13 | (55) | −6.0 | −1.8 | 150 | 147 | 746 | Inv. |
| 2-14 | (63) | −5.9 | −1.7 | 147 | 145 | 803 | Inv. |

Inv.: Inventive,
Comp.: Comparative Sample

Table 2 revealed that the organic EL elements of the present invention exhibited excellent luminance, external quantum efficiency as well as long life.

Example 3

Preparation of Full-Color Display

Full-Color Display (1)

(Blue Light Emitting Organic EL Element)

Organic EL Element 1-8 prepared in Example 1 was used.

(Green Light Emitting Organic EL Element)

Used was Organic EL Element 1-8G prepared in the same manner as Organic EL Element 1-8 in Example 1 except that Ir-1 was employed instead of Ir-12.

(Red Light Emitting Organic EL Element)

Used was Organic EL Element 1-8R prepared in the same manner as Organic EL Element 1-8 in Example 1 except that Ir-9 was employed instead of Ir-12.

The above blue, green and red light emitting organic EL elements were juxtaposed on the same substrate to prepare a full color display driven by an active matrix method, illustrated in FIG. 1. In FIG. 2, a schematic drawing of only display section A is shown. Namely, on the same substrate, a wiring section containing plural scanning lines 5 and plural data lines 6 and juxtaposed plural pixels 3 (pixels emitting red light, pixels emitting green light and pixels emitting blue light) are provided. The plural scanning lines 5 and plural data lines 6 of the wiring section are composed of an electroconductive material. The lines 5 and the lines 6 are crossing with each other at a right angle to form a lattice, and connected to the pixels 3 at the crossed points (not illustrated). The plural pixels 3 are driven by an active matrix method in which each pixel contains an organic EL element emitting a corresponding color light and active elements including a switching transistor and a driving transistor. When scanning signals are applied through the scanning lines 5, image data signals are received through data lines 6, and emission occurs according to the received image data. By juxtaposing red light emitting pixels, green light emitting pixels, and blue light emitting pixels side by side on the same substrate, display of a full color image becomes possible.

By driving the full color display, it was confirmed that a full color moving picture with high luminance, high emission efficiency, and long life was obtained.

Example 4

Organic EL element 1-8W was prepared in the same manner as Organic EL element 1-8 except that Ir-6 and Ir-12 (Ir-6 Ir-12=1:4) were used instead of Ir-12.

An illuminator was prepared by covering the non-emitting surface of Organic EL element with a glass case. Thus prepared illuminator was found to be a thin film white light emitting illuminator exhibiting high luminance, high emission efficiency and long life.

POSSIBILITY FOR INDUSTRIAL USE

The present invention enables to provide an electroluminescent element exhibiting high luminance, high emission efficiency and long life.

The invention claimed is:

1. An organic electroluminescent element comprising an anode and a cathode having therebetween an emission layer containing a phosphorescent compound and an layer adjacent to the emission layer, the layer adjacent to the emission layer being provided between the emission layer and the cathode, wherein the layer adjacent to the emission layer exhibits an effect of blocking holes and comprises a compound having at least one electron withdrawing group represented by —CF$_3$, and exhibiting a HOMO level of −5.7 to −7.0 eV and a LUMO level of −1.3 to −2.3 eV, wherein the compound comprised in the layer adjacent to the emission layer is represented by a formula selected from the group consisting of Formulas (2), (6), (11) and (12):

Formula (2)

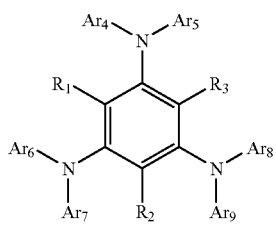

wherein $Ar_4$-$Ar_9$ each represent a phenyl group having —$CF_3$ as a substituent, and $R_1$-$R_3$ each independently represent a hydrogen atom;

Formula (6)

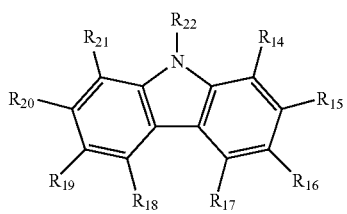

wherein $R_{14}$-$R_{21}$ each independently represent a hydrogen atom or a phenyl group having —F or —$CF_3$ as a substituent, and $R_{22}$ represents a phenyl group having —$CF_3$ as a substituent or a biphenyl group having —$CF_3$ as a substituent;

Formula (11)

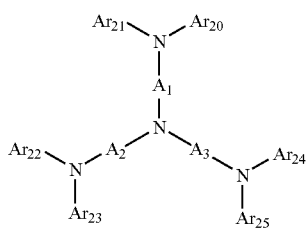

wherein $Ar_{20}$-$Ar_{25}$ each represent a phenyl group having —F as a substituent, and $A_1$-$A_3$ each represent a phenylene group having —$CF_3$ as a substituent; and Formula (12)

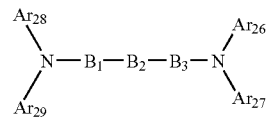

wherein $Ar_{26}$-$Ar_{29}$ each represent a phenyl group having —F or —$CF_3$ as a substituent, $B_1$ and $B_3$ each represent a phenylene group, and $B_2$ represents a divalent linking group selected from the group consisting of —C($CF_3$)$_2$—, —C(CN)$_2$— and —C($CH_3$)$_2$—$C_6H_4$—C($CH_3$)$_2$—.

2. The organic electroluminescent element of claim 1, wherein the compound is represented by Formula (2).

3. The organic electroluminescent element of claim 1, wherein the compound is represented by Formula (6).

4. The organic electroluminescent element of claim 1, wherein the compound is represented by Formula (11).

5. The organic electroluminescent element of claim 1, wherein the compound is represented by Formula (12).

6. The organic electroluminescent element of claim 1, wherein the compound exhibits a HOMO level of −5.9 to −6.8 eV and a LUMO level of −1.6 to −2.1 eV.

7. The organic electroluminescent element of claim 1, wherein the organic electroluminescent element emits blue light.

8. The organic electroluminescent element of claim 1, wherein the organic electroluminescent element emits white light.

9. A display comprising the organic electroluminescent element of claim 1.

10. An illumination comprising the organic electroluminescent element of claim 1.

11. A display comprising the illumination of claim 10 and a liquid crystal cell as a display means.

* * * * *